US009987653B2

(12) United States Patent
Sreenivasan et al.

(10) Patent No.: US 9,987,653 B2
(45) Date of Patent: *Jun. 5, 2018

(54) VERSATILE PROCESS FOR PRECISION NANOSCALE MANUFACTURING

(71) Applicant: Board of Regents, The University of Texas System, Austin, TX (US)

(72) Inventors: Sidlgata V. Sreenivasan, Austin, TX (US); Shrawan Singhal, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/293,884

(22) Filed: Oct. 14, 2016

(65) Prior Publication Data

US 2017/0106399 A1    Apr. 20, 2017

Related U.S. Application Data

(60) Provisional application No. 62/242,147, filed on Oct. 15, 2015.

(51) Int. Cl.
  *B05C 5/02* (2006.01)
  *B05D 3/06* (2006.01)
  (Continued)

(52) U.S. Cl.
  CPC .......... *B05C 5/0291* (2013.01); *B05C 11/028* (2013.01); *B05C 13/00* (2013.01); *B41J 2/01* (2013.01); *B81C 1/0038* (2013.01)

(58) Field of Classification Search
  None
  See application file for complete search history.

(56) References Cited

U.S. PATENT DOCUMENTS 3,324,700 A  6/1967  Elliott
4,791,437 A  12/1988  Accattino et al.
(Continued)

FOREIGN PATENT DOCUMENTS

CA    2902802 A1    9/2014
CN   103064197 A    4/2013
(Continued)

OTHER PUBLICATIONS

Ruchhoeft et al., "Patterning Curved Surfaces: Template Generation by Ion Beam Poximity Lithography and Relief Transfer by Step and Flash Imprint Lithography," J. Vac. Sci. Technol. B, vol. 17, No. 6, Nov./Dec. 1999, pp. 2965-2969.
(Continued)

*Primary Examiner* — Shamim Ahmed
(74) *Attorney, Agent, or Firm* — Robert A. Voigt, Jr.; Winstead, P.C.

(57) ABSTRACT

A method for depositing thin films using a nominally curved substrate. Drops of a pre-cursor liquid organic material are dispensed at a plurality of locations on a nominally curved substrate by one or more inkjets. A superstrate is brought down on the dispensed drops to close the gap between the superstrate and the substrate thereby allowing the drops to form a contiguous film captured between the substrate and the superstrate. A non-equilibrium transient state of the superstrate, the contiguous film and the substrate is enabled to occur after a duration of time. The contiguous film is then cured to solidify it into a solid. The solid is separated from the superstrate thereby leaving a polymer film on the substrate. In this manner, such a technique for film deposition has the film thickness range, resolution and variation required to be applicable for a broad spectrum of applications.

42 Claims, 8 Drawing Sheets

(51) Int. Cl.
B05C 11/02 (2006.01)
B05C 13/00 (2006.01)
B41J 2/01 (2006.01)
B81C 1/00 (2006.01)

(56) References Cited

U.S. PATENT DOCUMENTS

| | | | |
|---|---|---|---|
| 5,772,905 | A | 6/1998 | Chou |
| 6,921,615 | B2 | 7/2005 | Sreenivasan et al. |
| 6,964,793 | B2 | 11/2005 | Wilson et al. |
| 7,060,402 | B2 | 6/2006 | Choi et al. |
| 7,098,572 | B2 | 8/2006 | Choi et al. |
| 7,497,573 | B2 | 3/2009 | Warden et al. |
| 7,517,467 | B2 | 4/2009 | Shin et al. |
| 8,142,702 | B2 | 3/2012 | Liu et al. |
| 8,394,282 | B2 | 3/2013 | Panga et al. |
| 9,415,418 | B2 | 8/2016 | Sreenivasan et al. |
| 2004/0072364 | A1 | 4/2004 | Tisone et al. |
| 2007/0102844 | A1* | 5/2007 | Simon .................. B29C 59/022 264/259 |
| 2009/0243153 | A1 | 10/2009 | Sreenivasan et al. |
| 2010/0012622 | A1* | 1/2010 | Panga .................... B82Y 10/00 216/52 |
| 2014/0037859 | A1* | 2/2014 | Kobiki .................... B05D 5/02 427/532 |
| 2015/0048050 | A1 | 2/2015 | Sreenivasan et al. |

FOREIGN PATENT DOCUMENTS

| | | |
|---|---|---|
| WO | 0055686 | 9/2000 |
| WO | 2004016406 A1 | 2/2004 |
| WO | 2006025726 A1 | 3/2006 |

OTHER PUBLICATIONS

Shefiu S. Zakariyah, "Laser Ablation for Polymer Waveguide Fabrication, Micromachining Techniques for Fabrication of Micro and Nano Structures," InTech, 2012, pp. 109-130.

S.V. Sreenivasan, "Nanoscale Manufacturing Enabled by Imprint Lithography," RS Bulletin, vol. 33, Sep. 2008, pp. 854-863.

Bailey et al., "Step and Flash Imprint Lithography: Template Surface Treatment and Defect Analysis," J. Vac. Sci. Technol. B., vol. 18, No. 6, Nov./Dec. 2000, pp. 3572-3577.

Shrawan Singhal, "Jet and Coat of Adaptive Sustainable Thin Films," Dissertation, University of Texas at Austin, Aug. 2012, pp. 1-133.

International Search Report and Written Opinion of the International Searching Authority for International Application No. PCT/US16/57008 dated Jan. 26, 2017, pp. 1-12.

* cited by examiner

VERSATILE PROCESS FOR PRECISION NANOSCALE MANUFACTURING

GOVERNMENT INTERESTS

This invention was made with government support under Grant No. ECCS1120823 awarded by the National Science Foundation. The U.S. government has certain rights in the invention.

TECHNICAL FIELD

The present invention relates generally to fabrication of micro- and nano-devices, and more particularly to a versatile process for precision nanoscale manufacturing (e.g., figuring, polishing and patterning) on both nominally planar substrates and substrates with nominal free-form shapes.

BACKGROUND

Fabrication of most micro- and nano-devices including semiconductors, photonic and optoelectronic devices, microelectromechanical systems/nanoelectromechanical systems (MEMS/NEMS), electronic displays (such as Liquid Crystal Displays (LCDs)), etc. requires the deposition of many thin films. Several deposition options exist in the industry today. Deposition in the liquid phase is typically carried out by processes, such as spin-coating, which is often used as a precursor to subsequent reactions that solidify the liquid to obtain the desired thin film. In the vapor phase, the most commonly used technique is Chemical Vapor Deposition (CVD). In a typical CVD process, the substrate is exposed to precursors in the gaseous phase that react or decompose to form the desired film on the surface of the substrate. There are several types of CVD processes. Depending upon the pressure used, they can be classified as Atmospheric Pressure CVD (APCVD), Low Pressure CVD (LPCVD) or Ultrahigh Vacuum CVD (UHVCVD). Low pressures tend to reduce unwanted reactions and improve film thickness uniformity. Plasma based methods to enhance the chemical reactions, such as Plasma Enhanced CVD (PECVD) and Remote PECVD, are also used in the deposition of thin films in the semiconductor industry to lower deposition temperatures and protect the substrate from high-temperature effects. A technique called Atomic Layer Deposition (ALD) is also frequently used to produce conformal monolayers of one or different materials. Physical Vapor Deposition (PVD) methods too are important thin film deposition techniques. As the name suggests, they do not rely on chemical reactions, but deposit condensed forms of a vaporized material onto the substrate in a vacuum environment. Evaporative deposition and sputtering are two common examples of PVD. The former heats the material to be deposited to a high vapor pressure, while the latter utilizes a plasma discharge to bombard the substrate surface with atoms of the material to be deposited.

All the processes discussed above deposit thin films in a manner where the amount of material deposited per unit area is substantially the same. The ability to tailor materials to form intentionally non-uniform films is not typically possible for these processes, or requires frequent changes in hardware or tooling to accommodate variations in substrate geometry and desired film thickness profile. Also, processes, such as spin-coating, involve significant material wastage, while vacuum processes can be expensive due to the need to pump down chambers where processing is performed.

With the need for more sustainable processes, inkjetting has also become an attractive technique for material deposition as well as inexpensive patterning due to its direct write, "maskless" nature. However, due to the presence of a substantial vapor-liquid interface in the dispensed drops, evaporation and gradients in surface tension can cause local film thickness non-uniformity leading to the infamous "coffee-ring effect." Moreover, film thickness uniformity is also influenced strongly by the volume of the individual drops, the surface properties of both, the dispensed fluid as well as the substrate, and the spacing between consecutive drops, or the drop pitch, which needs to be low enough to allow the drops to spread and merge. Hence, in spite of having remarkably low material consumption, the above factors make process control for inkjet-based deposition of large area nanoscale thickness films challenging.

Flow coating has been developed at National Institute of Standards and Technology (NIST) as a velocity-gradient knife-edge coating process. A drop of the polymer solution is deposited on the substrate which is moved at constant acceleration. The competition between friction drag as a result of the velocity gradient action of the substrate and the capillary forces due to the stationary knife-edge placed ~200 µm above the substrate during the substrate motion creates a thickness gradient of the film. Subsequent evaporation leads to the realization of sub-micron thickness films. Thin polystyrene films with range even in the sub-200 nm regime have been demonstrated using this apparatus, but it is unclear whether films in non-monotonic profiles can be obtained using the same.

A variation of electrochemical deposition has also been used, in which varying thickness poly-electrolyte films have been deposited using spatially tunable electric field gradients. In addition, variable salt etching of polyelectrolyte films where the amount of material removed is controlled spatially to realize thin film thickness gradients has also been demonstrated. However, such techniques do not have the film thickness range and resolution required to be applicable for a broad spectrum of areas.

The deposition of ultra-thin films with functional gradients is an active area of research in the biomedical domain related to studying various factors involved in tissue engineering. To this end, biomimetic films have been fabricated by a layer-by-layer (LBL) assembly process, where it is possible to impart functional gradients at a molecular level and higher to screen events, such as protein adsorption and cell adhesion. The LBL techniques mainly proceed through a combination of various surface interactions, including electrostatic forces, van-der-Waals forces, hydrogen bonds, etc. Grafting of polymer molecules on functionalized substrates with temperature gradients also results in thickness gradients.

In addition to the above mentioned methods, vapor-based techniques are also available, primarily for depositing inorganic films with varying thicknesses. These techniques mostly employ a motion-controlled mask to generate the required thickness profiles, or use a discretized shower head with control over each shower unit. Such methods have limited film thickness variations that can be achieved and often require a change in hardware to generate a variety of profiles, thus constraining their versatility across various applications.

Hence, the currently used techniques for film deposition do not have the film thickness range and resolution required to be applicable for a broad spectrum of areas and have limited film thickness variations that can be achieved thereby requiring a change in hardware to generate a variety of profiles, thus constraining their versatility across various applications.

SUMMARY

In one embodiment of the present invention, a method for depositing thin films comprises dispensing drops of a precursor liquid organic material at a plurality of locations on a nominally non-planar substrate by one or more inkjets. The method further comprises closing a gap bringing between a superstrate and the substrate thereby allowing the drops to form a contiguous film captured between the substrate and the superstrate. The method additionally comprises enabling a non-equilibrium transient state of the superstrate, the contiguous film and the substrate to occur after a duration of time. Furthermore, the method comprises curing the contiguous film to solidify it into a solid. Additionally, the method comprises separating the superstrate from the solid thereby leaving a polymer film on the substrate.

In another embodiment of the present invention, a method for depositing thin films comprises depositing drops of a liquid solidifiable composition using a jetting system in a prescribed manner on a substrate, where the liquid solidifiable composition does not substantially penetrate a previously solidified composition. The method further comprises closing a gap between the substrate and a superstrate in a manner that merges the drops to form a contiguous film captured between the substrate and the superstrate, where the superstrate is locally smooth and possesses optimal bending rigidity. Furthermore, the bending rigidity is in an optimal range defined by it being higher than a minimum required to create a robust merging of the drops, while lower than a maximum required to ensure that the contiguous film does not equilibrate too quickly thereby providing an ability to capture pre-equilibrium transients.

In a further embodiment of the present invention, a method for patterning on non-planar substrates comprises applying a multiplicity of discrete portions of a fluid composition onto a surface of a non-planar substrate. The method further comprises closing a gap between a patterned template and the substrate leading to a fluid layer that is substantially free of bubbles. The method additionally comprises solidifying the fluid layer. Furthermore, the method comprises separating the patterned template from the substrate to leave behind a pattern on the non-planar substrate.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

The present invention presents a versatile process for three kinds of precision nanoscale manufacturing on both nominally planar substrates, and substrates with nominal free-form shapes. "Nominal shape," as used herein, refers to the desired shape and it is assumed that standard fabrication processes, such as machining, diamond turning and injection molding, have achieved this nominal shape which is close to the ideal desired shape. This means that the nominal shape still has some parasitics that exceed acceptable tolerances based on the intended use of the substrate.

The three kinds of nanoscale manufacturing (NM) include figuring (referred to herein as simply "NM1"), which involves changing the nominal shape of the substrate. For example, a planar substrate could be changed to a spherical nominal shape, or a spherical nominal shape could be changed to an aspheric, etc. The second kind of nanoscale manufacturing (NM) includes polishing (referred to herein as simply "NM2"), which involves any desired correction of low-, mid- or high-spatial frequency parasitics of the actual surface from a desired value to approach the nominal figure with much improved precision thereby achieving previously established tolerances.

Figure 1:
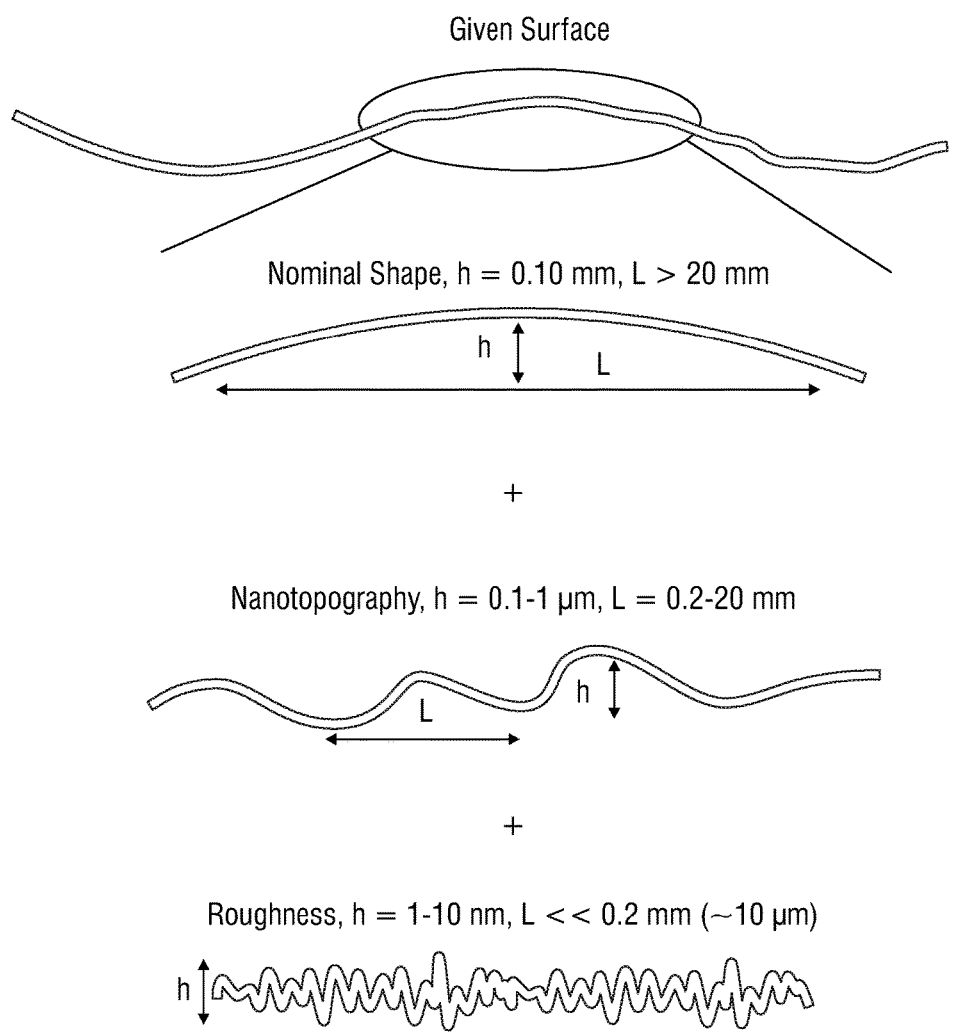
FIG. 1 illustrates the different scales of surface topography in accordance with an embodiment of the present invention.

The topography of the substrate and the superstrate (discussed further below) can introduce parasitic errors during planarization and polishing as shown in FIG. 1. FIG. 1 illustrates the different scales of surface topography in accordance with an embodiment of the present invention. As shown in FIG. 1, the topography of any surface can be classified in three broad categories, depending upon the amplitude and spatial wavelength of the same: (i) nominal shape (low spatial frequency), (ii) nanotopography (mid-spatial frequency) and (iii) roughness or nanoscale features (high-spatial frequency). The nominal shape is given by the largest spatial wavelengths, typically >20 mm with height variations typically from 0-10 mm. For spatial length scales of ~0.2-20 mm, height variations, usually ~200 nm-1 micron, at this spatial wavelength range are classified as nanotopography. Roughness is classified for lower spatial wavelengths with much smaller height variations. The presence of nanoscale patterns can further aggravate the high-spatial frequency topography, normally represented by roughness only. However, compensating for topography at given spatial frequency scales while minimizing any parasitic influence of topography at other scales (as seen in semiconductor planarization and polishing) can be challenging. This is where the model-based design of the PAINT process can be useful, as it adaptively caters to the compensation of topography at different length scales, while minimizing the influence of parasitics caused by overall surface topography.

The third kind of nanoscale manufacturing (NM) includes patterning (referred to herein as simply "NM3"), which involves fabricating nanoscale patterns on the substrate to enable a wide variety of capabilities, such as photonic, electrical, electronic, magnetic, biological, energy related, and mechanical functionalities.

The above family of processes is referred to herein as Programmable Adaptive Inkjetting of Nanoscale Thin-Films (PAINT). The present invention leverages and significantly enhances the PAINT method previously utilized. If the starting substrate is nominally planar, this process is known as PAINT-P, and if the starting substrate is nominally a curved surface, this process is known as PAINT-C. If the PAINT process addresses one or more the NM capabilities listed above, the resulting process is designated accordingly. For example, PAINT-C-123 implies a process that simultaneously addressed NM1, NM2 and NM3 on a nominally curved starting substrate, and PAINTP-13 implies a process that simultaneously addressed NM1 and NM3 on a nominally planar starting substrate. A "nominally curved" substrate, as used herein, refers to a nominally non-planar substrate. A description of the PAINT process is provided below.

Figure 2:
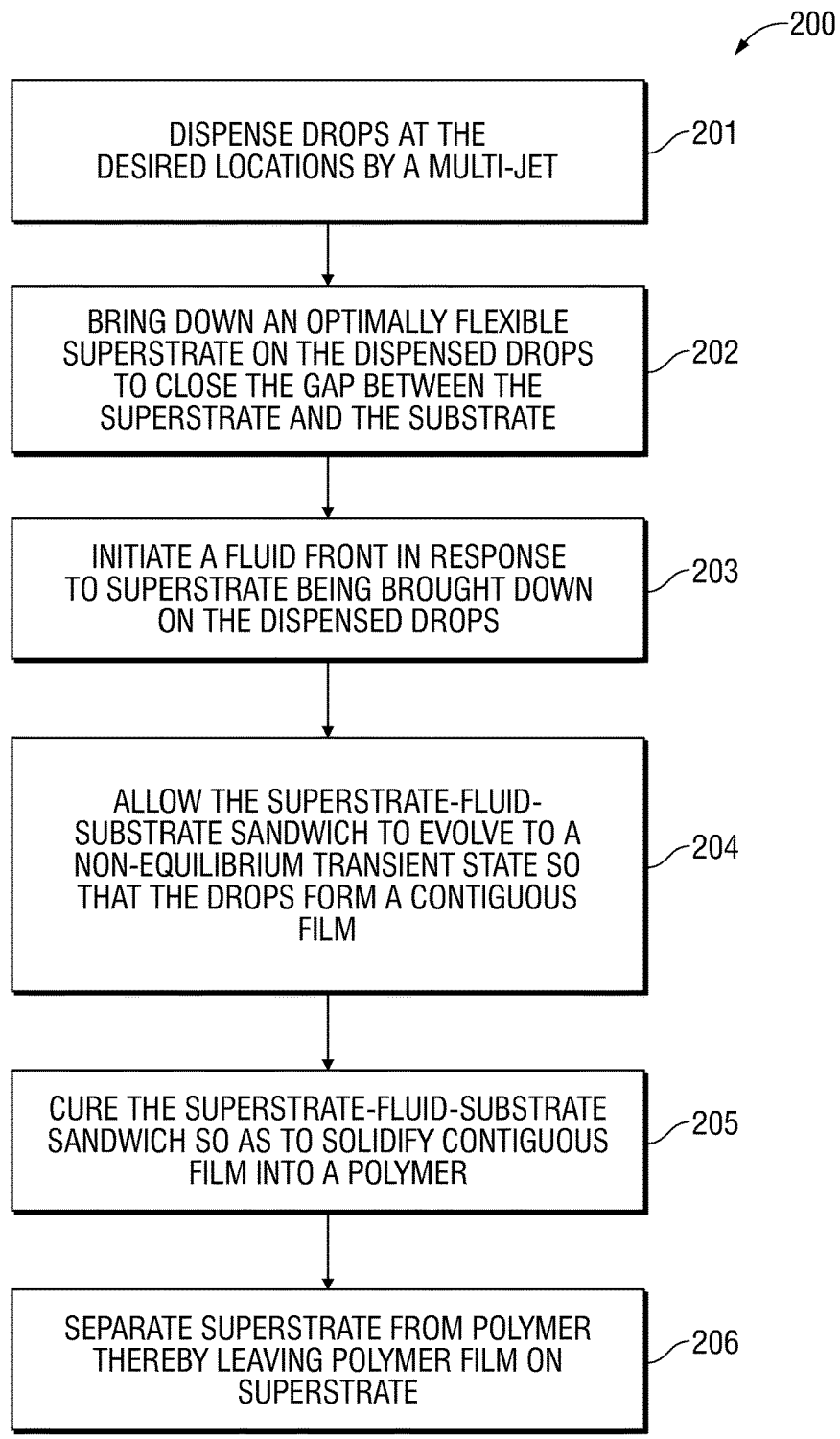
FIG. 2 is a flowchart of a method for depositing films with prescribed thickness variation using Programmable Adaptive Inkjetting of Nanoscale Thin-Films (PAINT) in accordance with an embodiment of the present invention.

A method for prescribed film thickness variation using PAINT is discussed below in connection with FIGS. 2 and 3A-3F. FIG. 2 is a flowchart of a method 200 for depositing films with prescribed thickness variation using PAINT in accordance with an embodiment of the present invention. FIG. 2 will be discussed in conjunction with FIGS. 3A-3F, which depict the cross-sectional views of depositing a thin film on a substrate during the fabrication steps described in FIG. 2 in accordance with an embodiment of the present invention.

As discussed herein, the "superstrate" needs to possess "optimal flexibility" wherein its stiffness is: (1) high enough to allow urging of the liquid organic material drops to merge laterally rather than trapping individual drops as islands with the superstrate wrapped around them; and (2) low enough that the strain energy stored in the superstrate due to its deformation does not significantly impact the thin film fluid dynamic behavior prior to curing or crosslinking of the monomer. This characteristic may also enable the superstrate to be selectively insensitive to low- and sometimes mid-spatial frequency topography features on the substrate.

Figure 3A:
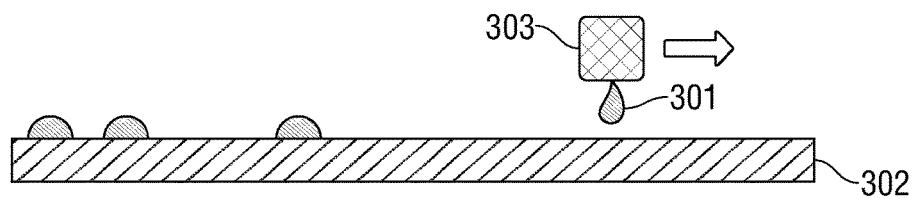
FIGS. 3A-3F depict the cross-sectional views of depositing a thin film on a substrate during the fabrication steps described in FIG. 2 in accordance with an embodiment of the present invention.

Referring to FIG. 2, in conjunction with FIGS. 3A-3F, in step 201, drops 301 of a material (e.g., a pre-cursor liquid organic material) are dispensed at the desired locations on a substrate 302 (e.g., nominally curved or non-planar substrate) by one or more jets, such as a multi-jet 303 as illustrated in FIG. 3A. Multi-jet 303 is represented by a single jet as a multi-jet array extends into the plane of FIG. 3A. The desired locations of the drops are derived from an inverse optimization framework. In one embodiment, the minimum volume of drops 301 dispensed is below 5 picoliters using either piezo jets or electro hydro dynamic jets. In another embodiment, the minimum volume of drops 301 dispensed is below 1 picoliter using either piezo jets or electro hydro dynamic jets. In one embodiment, substrate 302 is composed of a material with a Young's modulus greater than 1 GPa. In one embodiment, substrate 302 is a rigid wafer composed of one or more of the following materials: silicon, silicon dioxide and gallium nitride. In one embodiment, the minimum volume of drops 301 dispensed is below 10 picoliters using either piezo jets or electro hydro dynamic jets.

Figure 3B:
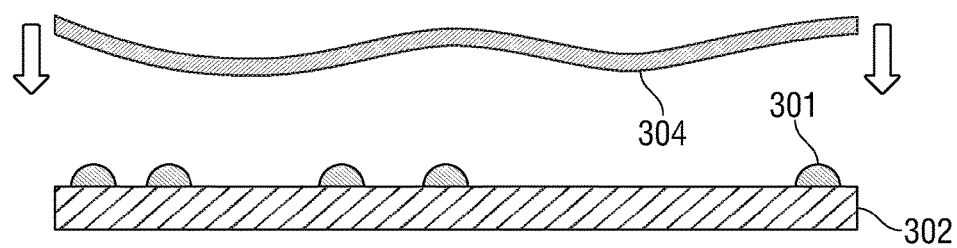

In step 202, an optimally flexible superstrate 304 is brought down on the dispensed drops 301 to close the gap between superstrate 304 and substrate 302 as illustrated in FIG. 3B. In one embodiment, superstrate 304 has a complementary shape to that of substrate 302. In one embodiment, superstrate 304 is composed of a thin film attached to or coated on a thicker backing. In one embodiment, the thin film is attached to the thicker backing which does not extend over an entire area of the thin film.

Figure 3C:
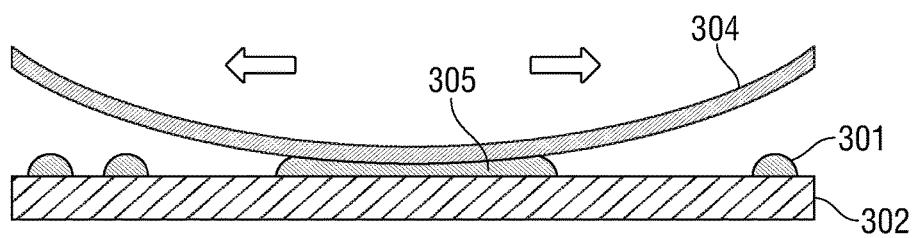

In step 203, a fluid front 305 is then initiated in response to superstrate 304 being brought down on the dispensed drops 301 as illustrated in FIG. 3C. The shape of superstrate 304 and the speed at which it comes down may be chosen to allow drops 301 to merge laterally to minimize any trapping of air bubbles (air pockets) to form a contiguous film. A local atmosphere of gases, such as $CO_2$, that is soluble in organic liquids or He that readily diffuses into most substrates 302 and/or superstrate 304 may be used in the substrate-superstrate sandwich region to further assist in avoiding trapping of bubbles in this process. The material of superstrate 304 can include a number of choices including, but not limited to, glass (e.g., quartz, fused silica, etc.), plastics (e.g., PMMA, polycarbonate, PET, PEN, etc.) or ceramics (e.g., Zerodur®), including ceramics with a thin film of a polymer. Plastic and ceramic materials have inherent porosity which further aids in the transmission of gases and avoids the trapping of bubbles. Superstrate 304 is typically polished to be locally smooth, i.e., possess low surface roughness (roughness is defined as amplitude variations across micron-scale spatial wavelengths). The surface of superstrate 304 may be coated with a low surface energy coating, such as FOTS or Teflon, while the surface of substrate 302 may be coated with an adhesion promoter, such as BARC, ValMat, or TranSpin. The use of superstrate and/or substrate coating will enhance the ability to leave the cured material onto substrate 302 at the end of this process. The inkjetted material can include UV-curable materials, such as MonoMat® and SilMat® materials offered by Molecular Imprints, Inc. or the mr-UVcur** offered by Micro-resist technologies.

Figure 3D:
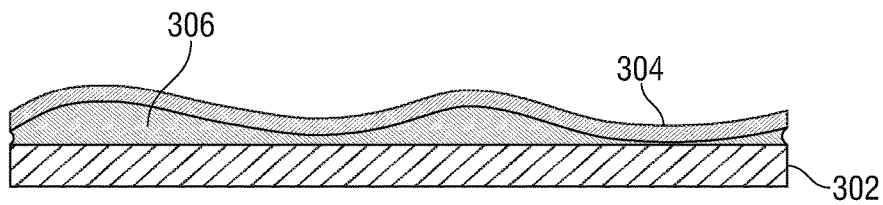

In step 204, the superstrate-fluid-substrate sandwich is allowed to evolve to a non-equilibrium transient state after a duration of time so that drops 301 form a contiguous film 306 with a superstrate layer 304 on top of the contiguous film 306 as illustrated in FIG. 3D. That is, a non-equilibrium transient state of superstrate 304, contiguous film 306 and substrate 302 is enabled to occur after a duration of time.

Figure 3E:
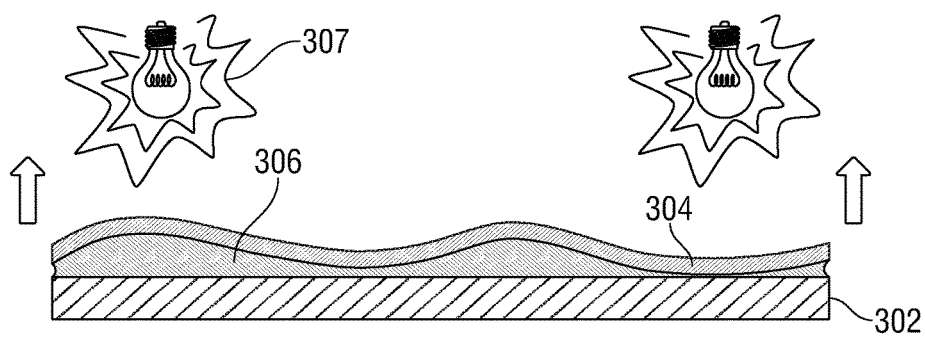

In step 205, the superstrate-fluid-substrate sandwich is cured from UV exposure 307 so as to crosslink contiguous film 306 into a solid (e.g., polymer) as illustrated in FIG. 3E.

Figure 3F:
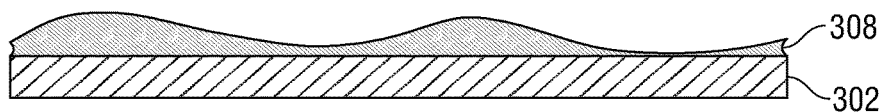

In step 206, superstrate 304 is separated from the solid (e.g., polymer) thereby leaving a film 308 (e.g., polymer film) on substrate 302 as illustrated in FIG. 3F. Substrate 302 is assumed to have the topography which needs to be polished or planarized, while superstrate 304 is essentially a vehicle for achieving the PAINT process. In one embodiment, polymer film 308 may be etched to allow a transfer of a film thickness profile to an underlying functional film or substrate 302 as discussed further below.

In some implementations, method 200 may include other and/or additional steps that, for clarity, are not depicted. Furthermore, in some implementations, method 200 may be executed in a different order than presented. Additionally, in some implementations, certain steps in method 200 may be executed in a substantially simultaneous manner or may be omitted.

The PAINT process discussed above possesses the following additional advantages. Such a process enables user-defined tailored film thickness profiles with nanometer scale accuracy at high process speeds. Most manufacturing processes that provide customization suffer from low process speeds, therefore cost-effective customization often remains elusive. In PAINT, the use of programmable inkjets in combination with optimal superstrates allows for both customization and high-speed (and therefore potential for low-cost processing).

Furthermore, such a process enables a very low consumable cost by having near-zero or low material wastage. Low consumable cost along with low capital cost (due to high-speed processing) makes PAINT a potentially cost-effective process for a variety of applications.

Additionally, the combination of enabling performance and customizability based on software and low cost has the potential to have significant advantages in the domain of correction of surface topography in the area of semiconductor planarization. This also encompasses any desired correction of low-, mid- and high-spatial frequency parasitics of the actual surface from a desired value without introducing additional parasitics at different length scales. Hence, this method inherently allows for surface "polishing" as well without the need for additional soft- or hard-lapping and polishing tools or ultra-precise pre-formed molds. Often, planarization, polishing and correction of undesirable parasitics can be achieved simultaneously, something which other processes in the same category find difficult to achieve.

PAINT is also substantially insensitive to the choice of substrate type, thickness or material and is capable of depositing films over large areas. By design, it can also substantially decouple the influence of systematic parasitics, such as surface topography, systematic inkjet drop volume changes, etc., and prevent them from corrupting the final film thickness.

The PAINT process discussed herein includes two modes of programmable material deposition: (1) inkjet based dispense of discrete curable monomer/oligomer drops where the drops are urged to form a contiguous film by the superstrate; and (2) inkjet based dispense of curable monomer/oligomer drops mixed with a solvent that assists the drops to spontaneously merge prior to the superstrate touching them, where a delay is included prior to the superstrate touching the liquid to allow the solvent to substantially evaporate prior to the superstrate touching the liquid.

The present invention also includes novel applications of the above processes in the areas of precision optics, biomedical optics, astronomical optics, integrated optics and nanophotonics, and specialized eye wear.

The PAINT processes discussed above possess the advantage of having a user-defined custom profile with nanometer scale accuracy at high process speeds. Most manufacturing processes that provide customization suffer from low process speeds, therefore cost-effective customization often remains elusive. In PAINT, the use of programmable inkjets in combination with the superstrates allows for both customization and high-speed (and therefore potential for low-cost processing).

Another advantage is having near-zero or low material wastage depending on the nature of the material deposition used (including the two modes discussed above). As a result, the consumable cost is very low. Low consumable cost along with low capital cost (due to high-speed processing) makes PAINT a potentially cost-effective process for a variety of applications.

This combination of enabling performance, customizability based on software and low cost has the potential to have significant advantages in the domain of ultra-precise optical surface generation for ophthalmic applications, astronomy applications, consumer optics as well as large area specialty optics. Generation of a new "freeform" surface, not only involves changing the figure of a surface, but also encompasses any desired correction of low-, mid- and high spatial frequency parasitics of the actual surface from a desired value, while keeping the nominal figure the same. Hence, in addition to an alternative technique for figure generation, this method inherently allows for surface "polishing" as well, without the need for additional soft- or hard-lapping and polishing tools or ultra-precise pre-formed molds. Often, both changing the nominal figure and correction of undesirable parasitics can be achieved simultaneously.

As previously discussed, in addition to generating freeform surfaces on planar or non-planar surfaces, the present invention also presents the ability to simultaneously (or subsequently) pattern nanoscale features on such substrates by using one or more embodiments of nanopatterning discussed below.

In one embodiment, one approach to simultaneous nanopatterning in addition to profiling/polishing uses an inkjet based deposition of discrete drops of curable monomer/oligomer mixture.

Another approach to simultaneous nanopatterning in addition to profiling/polishing, where the programmable film is deposited, is based on a solvent-assisted deposition approach.

A further approach is to first profile/polish using the inkjet based PAINT process followed by a subsequent thermal nanoimprinting process to create the nanopatterns.

Specifically, the generation of nanoscale features enables a wide variety of nanophotonic structures to be realized on the planar or non-planar surface, thereby potentially increasing performance as well as providing additional capabilities and customization for consumer optics. The concept of simultaneous nanopatterning, figuring and polishing can also be done on nominally planar or non-planar substrates.

PAINT-P and PAINT-C are also substantially agnostic towards the choice of substrate type, thickness or material and is capable of depositing films over large areas. By design, PAINT-P and PAINT-C can also substantially decouple the influence of systematic parasitics, such as surface topography, inkjet drop volume variation, etc., and prevent them from corrupting the final film thickness.

As discussed above, PAINT uses an inkjet to dispense droplets of a pre-cursor monomer on the substrate. The substrate surface may be pre-treated to enhance the spreading of the monomer and/or for adhesion of the polymerized material. If the inkjet has multiple nozzles, the desired substrate area can be covered with the required drops in a few seconds or less with a scanning stage driving the inkjet relative to the substrate, while retaining control over the volume and location of each dispensed drop. For each desired film thickness profile, the optimum drop volumes and locations are obtained from an inverse optimization routine wrapped around a simplified or linearized thin film lubrication model. As illustrated in FIGS. 3A-3F, following drop dispense, an optimally flexible superstrate 304 that has been bowed with the help of backside pressure or gravity, is brought down such that the first contact on drops 301 is made by the front side. This initiates a liquid front that quickly spreads outward merging with drops 301 and thereby creating a contiguous film 306. This substrate-fluid-superstrate "sandwich" is then allowed to evolve for a desired duration following which the monomer is cured by photonic or thermal energy to crosslink it into a polymer. Superstrate 304 is then separated from the sandwich leaving the thin polymer film 308 on substrate 302.

While it has been assumed that superstrate 304 is located above substrate 302 with the process being conducted on the substrate surface, the principles of the present invention apply to such embodiments where the relative location of the two surfaces may be reversed, i.e., substrate 302 may be located above superstrate 304. Similarly, in the inkjetting step, it may be substrate 302 or superstrate 304 on which drops 301 get dispensed, depending on the relative location of these surfaces. Also, in the separation step, either superstrate 304 or substrate 302 can be moved away from the other, without changing the nature of the process. While the following discusses substrate 302 as having the surface which needs to be "painted," the principles of the present invention are not to be limited as such and may include other surfaces that need to be "painted."

In one embodiment, if superstrate 304 is nominally planar and substrate 302 is nominally curved, then the first contact between substrate 302 and superstrate 304 needs to be detected by a force sensor system which could include one or more strain gauges, piezo sensors and current sensors in actuators among other force sensors. After the detection of the first contact, the actuator system closing the gap between substrate 302 and superstrate 304 will need to move substantially to complete the creation of the substrate-liquid-superstrate sandwich over the desired area. The distance moved after the first detection may be as much as 200 μm or several mm or several cm. If superstrate 304 and substrate 302 are nominally planar, then this distance moved is substantially lower than 200 μm.

There are several key concepts (listed below), some or all of which need to be integrated to create a viable PAINT process. These aspects, along with brief descriptions, are listed below:

(1) Dynamic thin-film lubrication model with fluid-structure interaction that includes the material properties of the substrate, superstrate and the inkjetted fluid material, the desired deposition area, the surface properties at both the superstrate-fluid interface and the fluid-substrate interface, and the geometry of the substrate and superstrate including their thickness profiles and the nature of surface topography on them.

(2) Model-based design of the superstrate geometry based on the properties of the substrate, inkjet and fluid material properties.

(3) Metrology of substrate and superstrate topography and its integration into the model-based solution.

(4) Linearization of the enhanced lubrication theory model that includes the topography information.

(5) Solution of the inverse optimization routine to get drop locations and volumes around the linearized model with integer constraints coming from discrete drop volumes and sometimes drop locations. In one embodiment, substrate 302 is discretized into grains, where a location and volume of drops dispensed in each grain are obtained by solving an inverse optimization problem to minimize an error between a function of an actual film thickness profile and a function of a desired film thickness profile. In one embodiment, the inverse optimization is augmented with a functional optimization routine to minimize an error between the desired and actual functional performance. In one embodiment, the inverse optimization includes discrete variables associated with drop volumes or drop locations.

(6) Functional optimization wrapped around the above inverse process optimization to ensure that the film thickness profiles do not lead to problems with post-PAINT processing.

(7) Precision of dispensed drops with respect to desired volume and their desired locations.

(8) Use of solvents to tailor drop volumes and also aid in the formation of a contiguous film prior to patterning nanoscale features.

(9) Use of optimally flexible combination of superstrate and substrate to enable formation of a contiguous film, while countering evaporative losses from a liquid free surface and also avoiding trapping of air pockets.

(10) Allowing the substrate-liquid-superstrate sandwich to evolve to a certain pre-defined time, prior to UV curing, as determined by the inverse optimization routine.

(11) Curing of liquid for solidification.

(12) Separation of superstrate and substrate from each other to get the desired thin film on the substrate.

There are various features of PAINT-C that will now be discussed in connection with FIGS. 3A-3F, including inkjetting.

PAINT requires additional modifications/interventions in a few key aspects to realize PAINT-C. Because of the presence of a nominal shape on substrate 302, inkjetted drops 301 will have varying in-flight distances to travel, thereby causing undesirable variations in drop positioning and/or volume. To compensate for the same, PAINT-C may use a coordinated z-translation of substrate 302 as it moves under inkjet 303, in order to maintain a desired gap height. This compensation is typically possible in one direction only and may not be completely achieved in the direction along the array of nozzles 303. This is particularly true for freeform surfaces where there might be gap height variations in both directions. Additional correction can be achieved by first calibrating the parasitic influence of drop location and height variations resulting from such gap height changes on the final film thickness profile and then including this calibration in the inverse optimization algorithm that will be discussed further below.

As discussed above, the use of multi-nozzle inkjet 303, while beneficial for higher throughput and lesser parasitics, suffers from the fact that the drop placement pitch is fixed along the direction of the nozzles. This may not be optimal for correcting curvature in the same direction, especially if there is relative z-displacement of substrate 302 with the inkjet. This can be overcome by using high-resolution single-nozzle inkjets, as described below. Another potential technique to overcome this limitation might be to virtually divide substrate 302 into two-dimensional (2D) manifolds or grains. Each grain should have a peak-valley difference not exceeding the optimal jetting range of inkjet 303, which is typically less than 1 mm. In one embodiment, the accurate stage motion is combined with z-displacement and/or rotational displacements such that each grain is treated as an individual substrate 302 by inkjet 303. The process works by positioning a grain under inkjet 303 to allow inkjet 303 to dispense an optimum drop pattern on that grain without compromising the optimum jetting range. This is followed by having substrate 302 and inkjet 303 undergo relative motion, which may include both rotation and translation, to position another grain under inkjet 303. This would enable inkjet 303 to dispense a second optimum drop pattern on that grain. This process is continued till the desired substrate area is covered. It should also be noted that while moving inkjet 303 and substrate 302 relative to each other to position the appropriate grain, substrate 302 and inkjet 303 should not interfere with each other. Appropriate modifications can then be made in the software to achieve optimum graining as well as for stitching the per-grain inkjetted drop patterns together into a single drop pattern for the full substrate. For example, if substrate 302 is spherically shaped with a 200 mm radius of curvature and the optimum jetting range is 1 mm, then if an area of substrate 302 equivalent to a 50 mm diameter needs to be deposited on, it will need four grains to cover substrate 302 while not exceeding the given optimum jetting range. A detailed description of the concept of virtual graining of a curved substrate 302 is discussed below in connection with FIG. 4.

Figure 4:
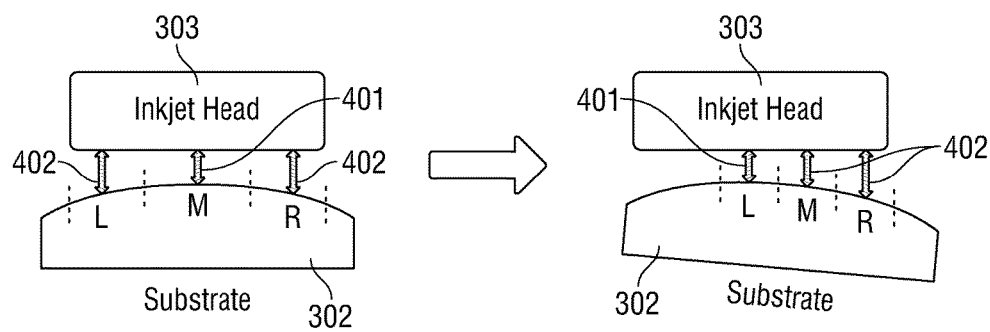
FIG. 4 illustrates virtual graining of a curved substrate in accordance with an embodiment of the present invention.

FIG. 4 illustrates virtual graining of a curved substrate 302 in accordance with an embodiment of the present invention.

Referring to FIG. 4, as can be seen from the illustration on the left, only a small portion of the curved substrate 302 is within the optimum inkjetting range (shown as arrow 401), while the rest is now (shown as arrows 402). Hence, substrate 302 is divided into two or more grains (illustrated above as three grains labeled L, M and R), such that at least one grain is within this optimum range. Inkjet 303 dispenses drops on this grain as per the drop pattern generated by the inverse optimization scheme. Then, substrate 302 is rotated and translated to position a second grain under inkjet 303, as shown in the illustration on the right. Now, at least this second grain is maintained at a gap within the optimum inkjetting range, while inkjet 303 dispenses drops on substrate 302 covered by this grain as given by the optimized drop pattern. This process is continued until the entire substrate 302 is covered.

In addition, the curved nature of substrates 302 and/or the realization of solvent-assisted thin film formation might require higher drop volume and placement resolution than what is necessary for similar film thickness profiles on planar substrates. To this end, higher resolution inkjets, such as electrohydrodynamic jets can be used. These jets can achieve sub-1 picoliter resolution, albeit at the cost of a single inkjet and/or lower inkjet dispense frequency. This can lead to parasitics, such as unequal evaporation, which can be compensated by putting more volume of liquid where there is higher evaporation prior to thin film formation or contact with superstrate 304. This can be fed into the inverse optimization scheme, thereby realizing correction of parasitics. In one embodiment, the liquid volume dispensed compensates for the deterministic parasitics which is one of the following: an evaporation profile of the liquid prior to it being captured between substrate 302 and superstrate 304, the shrinking effects across the film caused during solidifying, and any non-uniform etch signature coming from the etcher during post-processing as discussed in U.S. Pat. No. 8,394,282, which is hereby incorporated herein by reference in its entirety.

Another approach for catering to varying substrate curvature can be in the form of a tunable inkjet composed of a matrix of several single-nozzle inkjets. This is different from a standard multi-nozzle inkjet in that neighboring inkjet nozzles do not share a wall and can be relatively displaced. This matrix may be attached to a breadboard platform that has the capability to individually address and displace each inkjet nozzle, for example in the vertical direction. The displacement actuation can be in the form of a passive mechanism, such as a precision set screw, or actuated by piezoelectric, voice coil or other such actuation supported by flexure bearings, air bearings, mag-lev bearings, etc. The purpose behind this tunable inkjet is to be able to adjust the relative positions of each nozzle such that the matrix substantially correlates with the nominal figure of the substrate that needs to be "painted." In other words, this would allow inkjet 303 to dispense drops 301 with similar in-flight distances to travel and thereby would alleviate concerns with drop volume and location precision when a coplanar multijet is used to dispense drops on a non-planar surface. The relative adjustment of the inkjet nozzles is correlated with the output from the surface metrology tool. The exact amount of adjustment as well as the pitch between neighboring nozzles depends on the optimal jetting height, desired volume and location precision as well as the spatial wavelength scale of the starting topography. The matrix would then have to be scanned in the X-Y direction by an amount equal to or somewhat greater than the horizontal pitch of the jet locations in the matrix to allow drop placement at arbitrary locations. The assumption here is that the pitch is small enough and the nominal figure variation is low enough over this pitch to ensure that the vertical height variation minimally affects the error in the desired drop volume and drop location precision. In one embodiment, it is assumed that the matrix X-Y coverage subsumes the substrate projected area for any curved substrate to be processed by this inkjet matrix.

A further feature of PAINT-C that will now be discussed is the superstrate.

Apart from the inkjet, the use of an appropriate superstrate 304 is also of paramount importance. It needs to possess "optimal flexibility" wherein its stiffness is high enough to allow urging of the monomer drops to merge laterally rather than trapping individual drops as islands with superstrate 304 wrapped around them, and low enough that the strain energy stored in superstrate 304 due to its deformation does not significantly impact the thin film fluid dynamic behavior prior to curing or crosslinking of the monomer. It should also be low enough to substantially mitigate the presence of a substrate topography signature and be agnostic towards it.

In contrast to PAINT, the optimum superstrate design for PAINT-C also involves choice of an appropriate geometry that can not only provide the optimal flexibility, but also conform adequately with substrate 302 during the drop spreading and merging phase, as well as during the separation phase. One desirable superstrate approach involves the use of a superstrate geometry that is exactly complementary to the shape of substrate 302 used. Such complementary shapes can be easily found for lens doublet configurations. If such a configuration is not available, it can be generated by coating the substrate surface with PDMS, planarizing the top surface and then peeling the PDMS skin off to get a complementary shape with a planar back surface. Another embodiment involves the use of a geometry that is not substantially conformal but still has low strain energy, with its deviation from the exact shape captured in the model to get the desired fluid volume distribution. A third embodiment may be the use of a thin flexible film attached to a more rigid backing with fabricated or naturally occurring pores (such as Anodized Aluminum Oxide). The backing is attached to a superstrate chuck that has two vacuum zones, one, for example along an outer annulus, and one towards the inside. The control of vacuum is transferred through the porous backing to the thin film attached to it. When superstrate 304 is used in the spreading step, all vacuum zones are engaged, thereby allowing the thin film to be attached to the rigid backing. After spreading has been achieved, the inner vacuum zone is disengaged (or even allowed to blow positive pressure), thereby allowing the thin film to be only supported by the outer vacuum zone. This helps in substantially reducing the effective superstrate thickness (and hence, the rigidity) which is desirable in the evolution and capturing of pre-equilibrium transients. In one embodiment, the pre-equilibrium transients create a film thickness profile whose volume distribution is a function of the volume distribution of fluid drops dispensed on substrate 302. In one embodiment, the thickness of the thin film superstrate 304 could be as small as 200 nm up to as high as 200 µm for materials, such as polymers, glass, ceramics etc. The porous backing can have a thickness of 200 µm to 5 mm.

Figure 5:
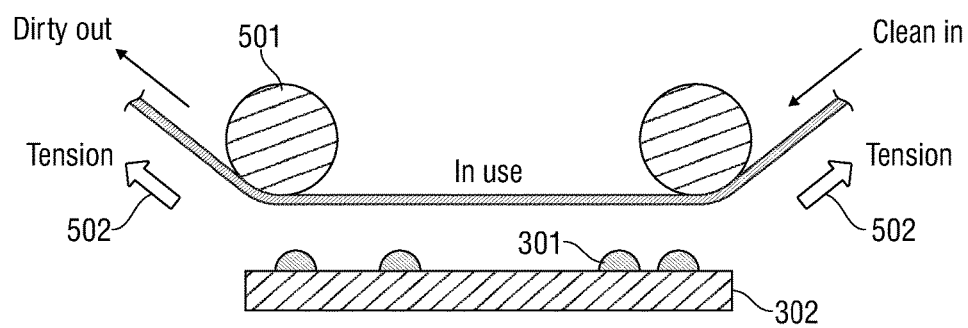
FIG. 5 illustrates a reloadable roll-roll configuration of the superstrate in accordance with an embodiment of the present invention.

Another desirable superstrate approach involves using a superstrate 304 that is quite flexible, is held in tension with an effective bending rigidity that is just high enough to ensure robust merging of drops, and the tension is reduced once drops 301 have merged to minimize the bending rigidity to enhance the ability to capture pre-equilibrium transients. The roll-to-roll flexible superstrate has an added benefit of allowing for quick re-loading to prevent repeated defects from particulate contamination. Because the superstrate embodiment is on a roll of plastic, it is relatively inexpensive leading to a significant reduction in process cost. This is shown in FIG. 5. In one embodiment, the roll-to-roll superstrate is advanced to bring in clean superstrates 304 to minimize propagation of contamination defects from one substrate 302 to another.

FIG. 5 illustrates a reloadable roll-roll configuration of superstrate 304 in accordance with an embodiment of the present invention. Referring to FIG. 5, in conjunction with FIGS. 3A-3F, in this embodiment, superstrate 304 is a roll of plastic 501 which is held under tension (see arrows 502). Only a part of the roll 501 is used as superstrate 304. Upon repeating the PAINT process, the used part can get contaminated from particulate matter as well as process defects. Once that is identified, rolls 501 can be rotated to bring in a cleaner superstrate area. After the entire roll is thus used, it can be discarded and a fresh roll loaded for quick process turnaround.

However, the addition of in-plane tension changes the evolution dynamics of the superstrate-fluid-substrate sandwich. In general, with a plastic superstrate thickness of 200 µm or lower, the in-plane stresses may be high thereby leading to the possibility of critical tensile or even buckling failure. Thus, while a thin superstrate 304 is desirable to make superstrate 304 more flexible and have a high process time scale, it should not be so thin that it fails in tension.

Another important feature of superstrate 304 involves promoting the spreading and dissolution of outgassed material before curing, and then separation after curing. This requires superstrate 304 to have good wetting properties with the precursor liquid, and then dewetting properties with the post-cured polymer. Such properties can be obtained by coating superstrate 304 with thin films of a metal oxide or metal. The surface of superstrate 304 can also be treated.

An additional feature of PAINT-C that will now be discussed is alignment.

Just like planar surfaces, non-planar surfaces too need surface profiling to get a map of parasitic topography. This map is important as it serves as an input to the inverse optimization framework for minimization of its signature. The preferred method for surface profiling is optical interferometry using a reference surface with curvature similar to the nominal substrate surface. This approach works well for spherical, aspherical (for e.g., paraboloid, elliptical, etc.), cylindrical and toric surfaces, for which high quality reference surfaces can be available. For freeform surfaces, this approach may be augmented with aberrometry to capture the relatively larger-scale deviations of the freeform surface from the base reference surface.

Any mismatch in coordinate frames between substrate 302 and the reference surface; and subsequently between substrate 302 and superstrate 304, or substrate 302 and inkjet 303 may result in unwanted parasitic signatures. This overall alignment typically ensures that the drop deposition and any subsequent PAINT or nanopatterning is performed on the correct locations. Tolerable errors in alignment depend on the nature of the substrate nominal figure and the amount of correction desired in a single PAINT step. Typically these errors may need to be <200 µm, <50 µm, <10 µm or <1 µm. When PAINT-C process is applied to high precision profiling applications, it consists of a metrology step before the deposition and nanopatterning steps, in which the topography of substrate 302 is measured with nanoscale vertical resolution using an optical interferometer, surface profiler, aberrometer or other similar instruments. In some cases, this instrument may be located in-situ, such that the topography is measured on substrate 302 as mounted (chucked), prior to performing the deposition and nanopatterning. The mounting of substrate 302 during metrology should substantially be the same as the functional (in-use) mounting of these precision surfaces. It is desirable that the mounting introduces minimal distortions (or similar distortions) during metrology and functional use. It may be based on approaches such as kinematic mounts, where the only distortion comes from gravitational sag, which is relatively easy to model and compensate for using PAINT-C. This constraint of matching distortions with the metrology mounting scheme is less important during the execution of the PAINT process because, as far as the substrate distortions do not cause significant changes in local slope of the substrate (changes in slope being less than about 0.25 radians), the PAINT process will tolerate the substrate distortions.

To this end, it becomes necessary to establish proper alignment of the substrate coordinate system relative to the inkjet coordinate system. The location (x,y) and orientation (theta) of all coordinate systems, i.e., substrate coordinate system (SCS), metrology coordinate system (MCS) and the inkjet coordinate system (ICS) need to be known with micron-scale precision (depends on application and may need to be <200 µm, <50 µm, <10 µm or <1 µm) relative to the global stage coordinate system (GSCS). It is important to minimize the introduction of parasitic topography errors coming from misalignment between the actual substrate topography and the topography that is corrected by the inkjet. Such a strategy for minimizing such parasitic topography errors is discussed below using an in-situ alignment system of FIG. 6.

Figure 6:
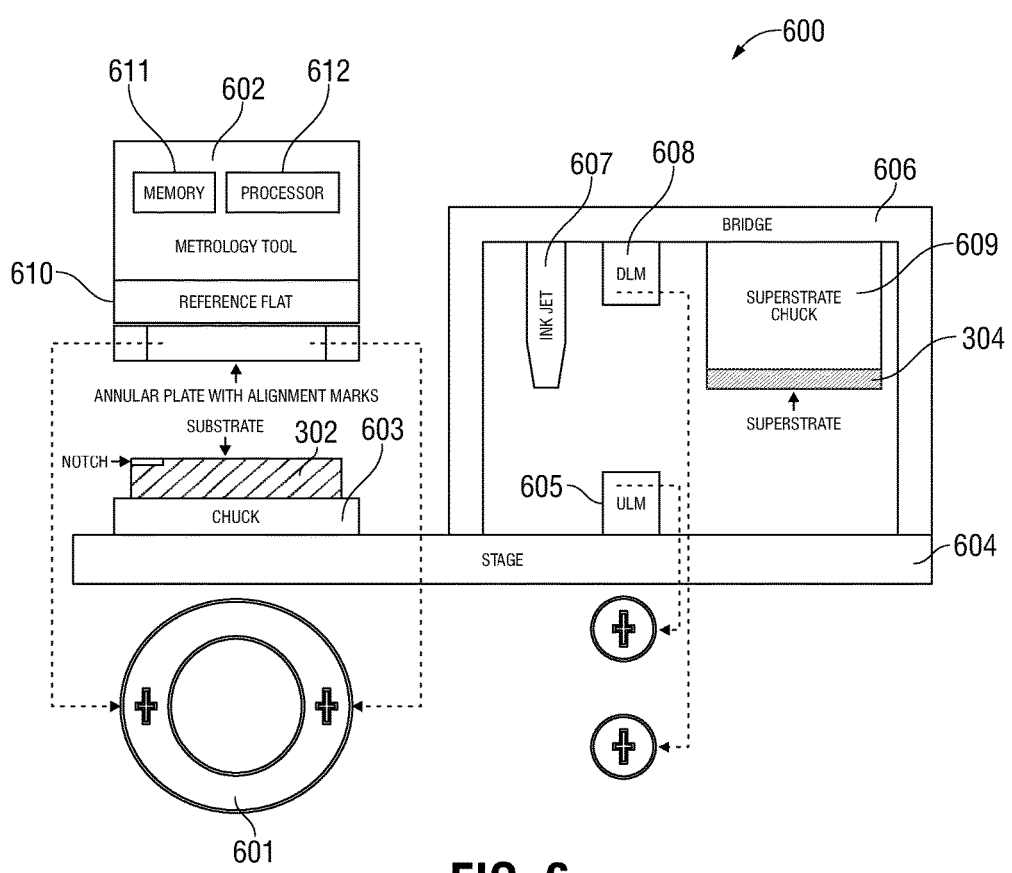
FIG. 6 illustrates an in-situ alignment system for minimizing parasitic topography errors in accordance with an embodiment of the present invention.

FIG. 6 illustrates an in-situ alignment system 600 for minimizing parasitic topography errors in accordance with an embodiment of the present invention.

Referring to FIG. 6, annular plate 601 with alignment marks (see "+" in FIG. 6) is affixed to a metrology tool 601. FIG. 6 further shows a plan view to demonstrate that the alignment marks may be offset across different areas of plate 601 to get good orientation (theta) calibration. Substrate 302 with a notch or other identifiable feature is chucked 603 and mounted on an x-y-theta stage 604 fitted with an upward looking microscope (ULM) 605. A bridge 606 has the inkjet 607, a downward looking microscope (DLM) 608 and a superstrate chuck 609 with superstrate 304 affixed to it. Similar plan views of ULM 605 and DLM 608 are shown to depict that they are in a dual configuration for enabling orientation calibration and correction. In one embodiment, stage 604 may include two separate stages, where one of the stages is used for moving substrate 302 to superstrate chuck 609 and the other stage is used for moving substrate 302 to metrology tool 602.

A process for minimizing parasitic topography errors using in-situ alignment system 400 is discussed below in connection with FIG. 7.

Figure 7:
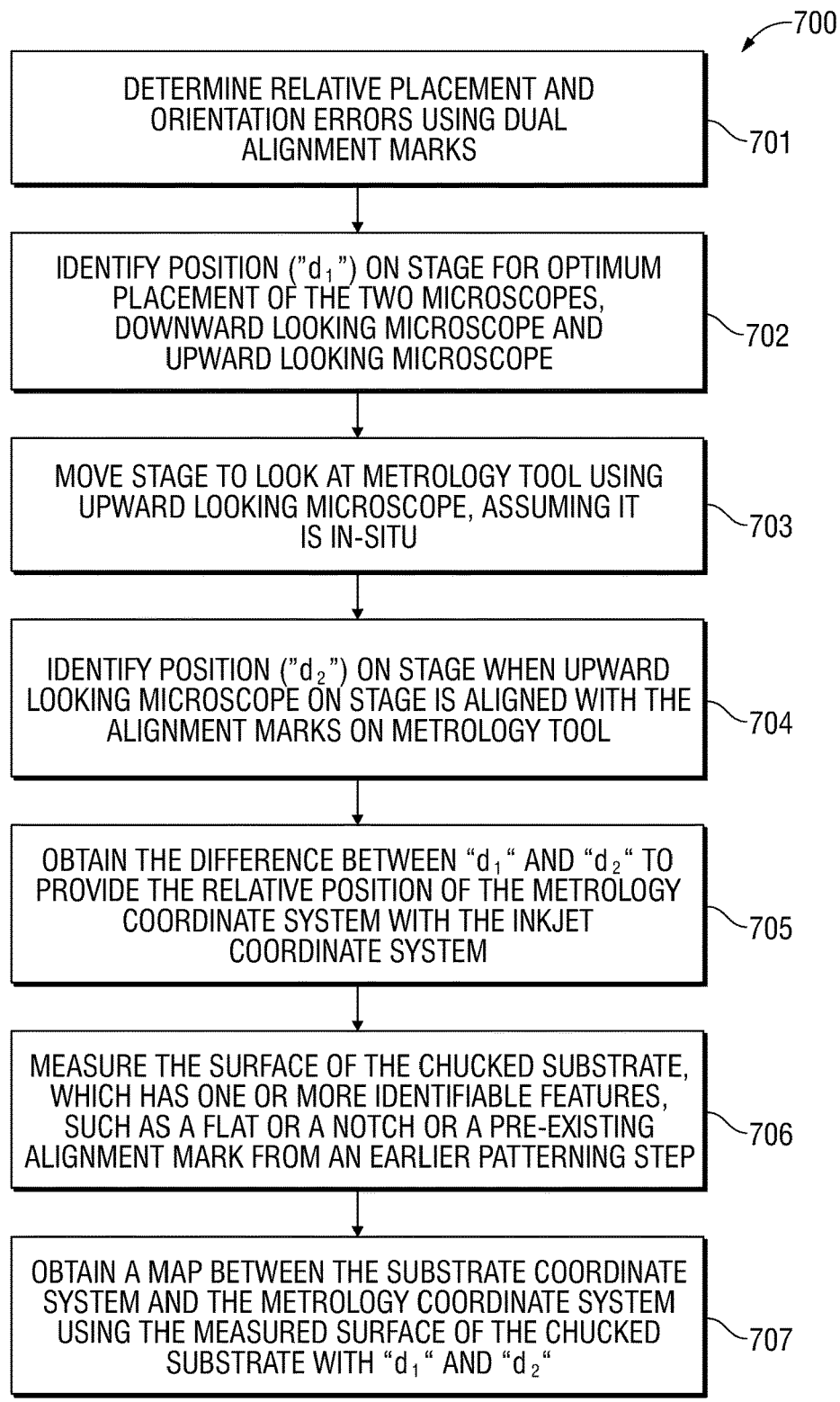
FIG. 7 is a flowchart of a method for minimizing parasitic topography errors using the in-situ alignment system of FIG. 6 in accordance with an embodiment of the present invention.

FIG. 7 is a flowchart of a method 700 for minimizing parasitic topography errors using in-situ alignment system 600 in accordance with an embodiment of the present invention.

Referring to FIG. 7, in conjunction with FIG. 6, in step 701, relative placement and orientation errors are determined using dual alignment marks on DLM 608 and ULM 605 (such as box-in-box and/or cross-in-cross type features). In particular, such errors are discovered by using DLM 608 that is affixed to the same bridge 606 as inkjet 607 and the superstrate chuck 609 to look at ULM 605 that is attached to stage 604. The size of these features, the distance between the dual marks, and the X-Y-theta stage precision determines the level of positioning accuracy that can be achieved.

In step 702, the position ("$d_1$") on stage 604 for the optimum placement (after correction) of the two microscopes is identified, such as by the stage location sensor (e.g., encoder), when the dual alignment marks are aligned, where the position "$d_1$" includes x, y and theta positions. Subsequently, in step 703, stage 604 is then moved to look at metrology tool 602 using ULM 605, assuming it is in-situ. In one embodiment, metrology tool 602 is modified and retro-fitted with an annular surface that is in a fixed relative location with the reference surface 610 as shown in FIG. 6, with annulus 601 having alignment marks similar to the DLM/ULM 608/605.

In step 704, again, optimum stage placement and orientation is achieved after correction and noted when ULM 605 on stage 604 is aligned with the alignment marks on metrology tool 602 (alignment marks of annular plate 601 affixed to metrology tool 602). This stage position is noted as "$d_2$" (x, y, theta positions). In other words, the position ("$d_2$") on stage 604 is identified when ULM 605 is aligned with the alignment marks on metrology tool 602 (aligned with alignment marks of annular plate 601).

In step 705, the difference between "$d_1$" and "$d_2$" is obtained to provide the relative position of the metrology coordinate system with the inkjet coordinate system.

After this, the surface of the chucked substrate 302, which typically has one or more identifiable features, such as a flat or a notch or a pre-existing alignment mark from an earlier patterning step, is measured on metrology tool 602 in step 706. The lateral precision of metrology tool 602 may be similar to that of the microscopes. If that is not accurate enough, DLM 608 can be used to precisely locate the notch and know the substrate coordinate system with respect to the inkjet coordinate system. Then, with knowledge of the metrology coordinate system with respect to the inkjet coordinate system, substrate 302 can be precisely located for topography measurement. In one embodiment, inkjet 607 can be used to overcome errors in precision substrate location and alignment, particularly, if inkjet 607 has been precisely located and there are substantial errors in loading substrate 302 on chuck 603 every time it is mounted. Inkjet 607 may be used to dispense drops (that are then also cured) on substrate 302 on an area that is substantially removed from the area that needs to have the tailored film deposited, such that the drops do not interfere with the PAINT process depositing the tailored film. These drops can be analyzed under the same DLM 608 which is used to identify the substrate notch, thereby giving the relative position and orientation of substrate 302. If such area is unavailable, the drops may be dispensed on a small secondary surface that is structurally connected to substrate chuck 603 such that it can be located accurately and repeatably with respect to substrate 302, and which is substantially at the same level as substrate 302. This approach can help overcome errors in precision substrate location and alignment.

In step 707, using the measured surface of the chucked substrate 302 with "$d_1$" and "$d_2$," a map between the substrate coordinate system and the metrology coordinate system is obtained with micron-scale precision.

This procedure allows for substrate 302 to be located with micron-scale precision between metrology tool 602 and inkjet 607. The position and orientation of inkjet 607 itself can be calibrated one-time by first locating ULM 605 through DLM 608 to establish a "zero" reference for stage 604. Then, an array/matrix of drops can be inkjetted and cured on a dummy substrate 302. This array/matrix of drops can then be examined under DLM 608. The location of each drop can be used to finely calibrate the location of each nozzle. Coarse positioning and orientation calibration can be done through drops at the center and the ends of the array or matrix. For this purpose of one-time calibration, the drops can be dispensed at a lower frequency or with lower stage speed. The inkjet height may also be reduced. These measures may help increase the precision of the location of the inkjetted drops, such that the dispensed drop locations match substantially with the ideal drop locations. In other words, errors in the drop location on substrate 302 that arise from the inkjet head operation as well as the synchronization of the inkjet head operation with stage motion will be reduced. If the drops do not provide sufficient precision because of variation in drop placement accuracy, ULM 605 can be used to locate the inkjet head and the best fit line of the nozzles. In one embodiment, ULM 605 images the inkjet nozzles to determine the best fit line. In this manner, a position on stage 604 can be identified in response to ULM 605 determining the best fit line. In one embodiment, such a position includes x, y and theta positions. The location and orientation of this line can then be available in the inkjet coordinate system. Usually, the stage precision is much better than inkjet drop placement accuracy. Hence, this approach can lead to higher precision in locating the inkjet and metrology tool.

Also, if metrology tool 602 cannot be located in-situ, the topography measurement of substrate 302 may be done offline. Ex-situ metrology may be done with the same or similar metrology tool fitted with the same/similar annular ring 601 having alignment marks. A DLM 608 can also be affixed to metrology tool 602 and the same or similar substrate process chuck can be mounted on an x-y-theta stage fitted with ULM 605. First, DLM 608 and ULM 605 can be aligned to correct for global chuck positioning errors. Thereafter, ULM 605 and annular plate 601 can be used to calibrate the offset between metrology tool 602 and DLM 608. Substrate 302 can then be measured on metrology tool 601. Alignment errors between metrology tool 602 and the chucked substrate 302 can be corrected by locating the notch/flat precisely under DLM 608 fixed to metrology tool 601. Using the calibrated offset between metrology tool 602 and DLM 608, the precise location of the notch (and consequently, the entire substrate 302) can be obtained as viewed on metrology tool 601. This procedure assumes that the lateral resolution of metrology tool 602 is not sufficient to locate the notch with micron-scale precision. If, however, the converse is true, this procedure may not be needed. Similarly, on the PAINT tool, ULM 605 on stage 604 and DLM 608 on bridge 606 are used to locate inkjet 607 and the notch on substrate 302, as described in the in-situ metrology procedure above. When combined with the ex-situ precise location of the notch on metrology tool 602, this gives the precise location of substrate 302 on the PAINT tool with respect to the ex-situ metrology tool.

In both the ex-situ and in-situ metrology setups, the annular alignment plate 601 fixed to metrology tool 602 is utilized. Hence, precise assembly of this plate 601 with metrology tool 602 may be required, necessitating the use of precision assembly techniques.

In one embodiment, the steps of method 700 are automated, such as via a program stored in memory 611 whose instructions are executed by a processor 612.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Another feature of PAINT-C is chucking, which will now be discussed in connection with FIGS. 6 and 7.

As discussed above, chucking of substrate 302 and/or superstrate 304 has to take into account the parasitic distortions and how it would affect metrology as well as the PAINT-C process. (In general, the superstrate stiffness is not defined by the application, and can be kept chosen to be "low enough" as discussed earlier to minimize effects of distortion due to chucking.) Chucking is important to ensure that substrate 302 does not move substantially due to the forces involved in the PAINT process. Chucking of non-planar surfaces could be more involved than planar surfaces and if not done correctly, can introduce parasitic errors. If substrate 302 that needs to be "painted" has a planar back surface, chuck similar to that for PAINT-P can be used. If, however, the back surface is also curved, then substrate 302 may be held over an area that is substantially less than the entire back surface area, or substantially similar to the back surface area. The same ideas can be extended to superstrate 304 as well, although the ensuing discussion has been done with an embodiment of a substrate 302 with a curved back surface. Moreover, regions in substrate 302 and superstrate 304 can be left open to allow optical curing or inspection of the surfaces. In general, the following strategies can be employed to chucking curved back surfaces:

(1) Use of a chuck with the near-exact complementary profile to that of substrate 302. However, this strategy may not be viable if the substrate geometry keeps changing, thus necessitating a large number of such chucks.

(2) Addition of a planar back surface, either completely or partially in the form of flanges with the help of processes, such as welding, gluing etc., or by including it in the raw material substrate that is created in the first place.

(3) Use of a multi-region chuck with each region being controlled independently with some regions providing vacuum for holding substrate 302 and other regions providing pressurized air for pneumatically supporting those regions of substrate 302. In one embodiment, these multiple regions are isolated from each other using pneumatic seals as shown in FIG. 8.

Figure 8:
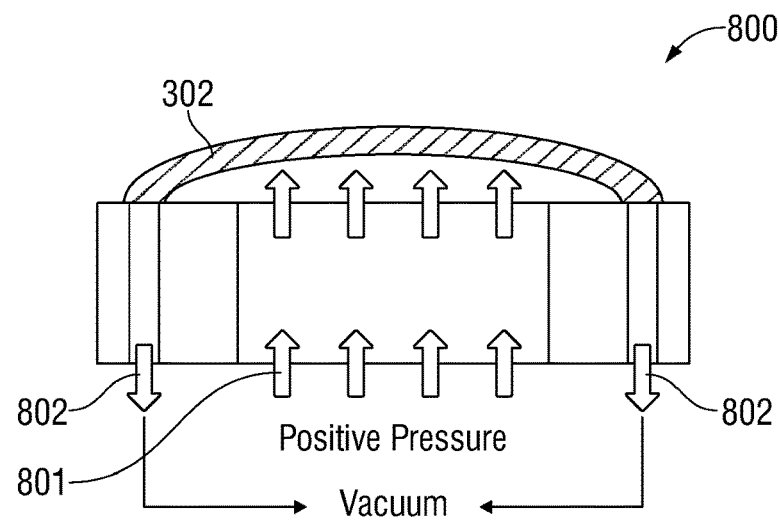
FIG. 8 illustrates a multi-region chuck for holding substrates with a curved back surface in accordance with an embodiment of the present invention.

FIG. 8 illustrates a multi-region chuck 800 for holding substrates 302 with a curved back surface in accordance with an embodiment of the present invention. In on embodiment, multi-region chuck 800 may enable the same chuck to hold different surfaces. The pressurized air regions of substrate 302 (see arrows 801) can be combined with standard chucking. In regions that are typically curved and that cannot be chucked using standard vacuum (see arrows 802) or electrostatic chucks, this pressurized air may be used to support forces during the PAINT-C process on non-planar substrates. This pressurized air can also be used in combination with vacuum or electrostatic chucking to support portions of the back side of substrate 302 that cannot be substantially chucked using the above vacuum or electrostatic chucking strategies to minimize contact that may lead to damage, such as scratches or pitting to specific portions of the back surface that are functionally relevant to the way substrate 302 is subsequently used in applications.

A further feature of PAINT-C is peeling mechanics, which will now be discussed in connection with FIGS. 2 and 3A-3F.

After UV-curing, superstrate 304 is separated from substrate 302 in PAINT by adjusting the bending profile of superstrate 304 to create a crack front from the edge to the center. However, given the presence of substrate and superstrate curvature, a similar approach may require usage of additional mechanisms. For example, for PAINT-C, superstrate 304 can be coated with a thin film of a sacrificial material. Prior to the start of the peeling process, the sacrificial film can be removed from the edges of the superstrate-polymer-substrate sandwich by exposing superstrate 304 to an ambient environment (or using photochemical ablation) that can sublimate the sacrificial film. Removal of the film creates a crack front, which can then be propagated using the appropriate superstrate bending profile. If at any time in the separation process, local peaks or valleys cause temporary cessation of the crack front, the above approach can be used to force open and propagate the crack front. Photochemical laser ablation may be used as a potential technique to achieve the above-described sublimation of a polymer film. This can be done by coating superstrate 304 with a thin film of a polymer that has a substantially different ablation threshold intensity and/or laser wavelength compared to that for the deposited film and the superstrate/substrate (304/302) materials. For example, if the deposited material were Poly(methyl methacrylate) (PMMA) or a comparable acrylate which is cured at a wavelength of 355 nm, the sacrificial film could be polyimide (PI), which has a laser ablation threshold of 40 $mJ/cm^2$ at a different wavelength of 248 nm. On the other hand, PMMA has a much higher threshold of 600 $mJ/cm^2$ at 248 nm. Hence, exposure to a low (~50 $mJ/cm^2$) dose of 248 nm laser would ablate the PI, but keep the deposited film (PMMA) intact. Superstrate 304 may then be treated as a consumable and discarded or re-processed to get the sacrificial film deposited again. The "R2R" configuration may provide additional benefits in allowing the above process to be automated with a given region of the R2R superstrate 304 used only once followed by re-processing or discarding the used superstrate 304.

Another approach could be the use of handles or flanges on superstrate 304. They could be mechanically held by the superstrate chuck 409, and then pulled to assist in peeling superstrate 304 off substrate 302. This could be in addition to the existing vacuum- and positive pressure-based profile control of superstrate 304 (or substrate 302) combined with vertical translation of the superstrate (or substrate) chuck.

Also, the R2R superstrate configuration previously discussed may be more amenable to peeling off nominally non-planar substrates. This is primarily because of the presence of tension and control of crack propagation through control of roller motion, including relative rotation and translation of the rollers with respect to the line of contact. It should be mentioned that the separation or peeling parameters are more relaxed for films without patterns than for those with nanoscale patterns.

Some representative materials that may be used as the deposited film include inkjettable compositions, such as an etch barrier solution, mv-Cur from Microresist Technologies, Monomat® from Canon Nanotechnologies. Substrates 302 may also need to be pre-treated to tailor the wetting properties. Some materials that may be used for promoting adhesion between substrate 302 and the deposited film include ValMat® and Transpin® from Canon Nanotechnologies. Some substrate materials, such as polycarbonate, may not need to be pre-treated as they naturally have the desired wetting and adhesion characteristics. Materials that could be used to treat the surface of superstrate 304 for improving interfacial properties have been discussed above.

The use of solvents also assists in the tailoring of drop volumes by controlling the amount of volatile solvent material (for example, PGMEA, Hexane, etc.) and the associated solids content in the inkjet liquid formulation. The solvent material inside a drop can be partially or completely evaporated, either in flight or after contact with the substrate, thereby reducing the volume of the drop that is used towards PAINT or for solvent-assisted layer formation. For example, due to hardware limitations, inkjet nozzles might be constrained in the drop volume resolution. However, accounting for fine substrate curvature locally might require drop volumes lower than the minimum drop volumes that can be dispensed. This information can be obtained from the inverse optimization algorithm by comparing the final film thickness profiles at higher and lower drop volume resolutions with the desired film thickness profile. If having finer drop resolution leads to a substantially lower error norm in the model (which has been discussed later), then pursuing this approach for smaller drops is expected to benefit the particular desired surface profile.

Fluid flow in domains that have much larger lateral length scales compared to height (thin films) can be solved using the lubrication approximation which assumes that the flow is predominantly parallel to the surface and the perpendicular pressure gradient is zero. Typically, this leads to a nonlinear model, which can be linearized for lower computational cost and better understanding of the process mechanics. Linearization leads to a characteristic process time scale obtained as:

$$\tau_{paint} = \frac{12\mu R^6}{D_{eff} h_0^3 \pi^6} \quad (1)$$

$$D_{eff} \propto \left[ \rho g R^2 R_1^2, \frac{Eb^3}{(1-v^2)} \right] \quad (2)$$

where $h_0$ is the mean film thickness, R is a horizontal length scale, typically the radius of the deposited area, and $D_{eff}$ is the effective bending rigidity of superstrate 304. This effective bending rigidity typically has two asymptotic values, with one dependent on the substrate curvature, $R_s$, and gravity, g; and the other dependent on the Young's modulus, E, superstrate thickness, b and Poisson's ratio, v, of the superstrate material. Gravity effects are important for substrates 302 with a nominal non-planar figure as fluid in different regions of substrate 302 is subjected to differing levels of gravitational forces. In general, a larger value of $\tau_{paint}$ is desirable as it provides a longer time to capture the pre-equilibrium transients. From Eq. 1, a smaller $D_{eff}$ appears to lead to higher $\tau_{paint}$. However, as shown in Eq. 2 for $D_{eff}$, $D_{eff}$ includes R, $R_s$; and these values also indirectly affect $h_0$. This is shown in FIG. 9.

Figure 9:
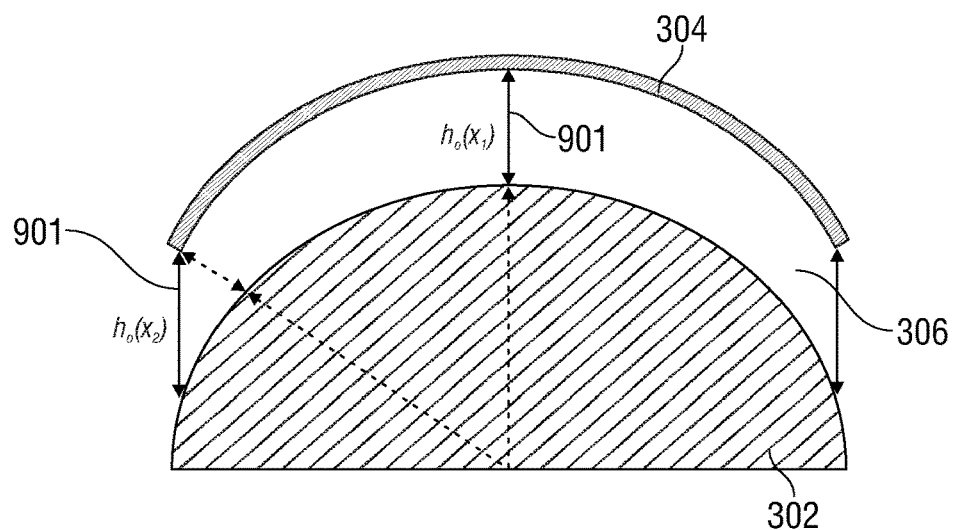
FIG. 9 illustrates that the film thickness, $h_0(x)$, is the vertical projection of the thickness of the film measured normally to the substrate in accordance with an embodiment of the present invention.

FIG. 9 illustrates that the film thickness 901, $h_0(x)$, is the vertical projection of the thickness of the film measured normally to substrate 302 in accordance with an embodiment of the present invention. Hence, for x close to the center of curvature (e.g., $h_0(x_1)$) of substrate 302, the vertical projection is close to the actual film thickness value. But, for x away from the center of curvature (e.g., $h_0(x_2)$) of substrate 302, the vertical projection can be much larger. Gravity is not so important for the former, but comes into play for the latter.

Therefore, the negative effect of gravity is high when substrate 302 has regions whose surface tangents form angles (with respect to the horizontal plane) with relatively high absolute value; while having relatively high superstrate stiffness as well. Therefore, a suitable process condition (which implies high values of $\tau_{paint}$) requires low tangent angles or low superstrate stiffness, but preferably both. In the event substrate 302 does not possess the desired low tangent angles, all efforts should be taken to make superstrates 304 that possess low stiffness. For example, for a painted area of 200 mm diameter and a radius of curvature of 200 mm, the thickness of a fused silica superstrate 304 should be approximately 200 microns or lower if the effect of gravity is mitigated compared to the effect of the superstrate rigidity. However, if both, effective stiffness because of gravity and superstrate bending rigidity, are substantially low, it may not be important to substantially mitigate the influence of gravity. This is because the aim of the process is to minimize the effective rigidity, irrespective of the physical origin of the rigidity, in order to achieve a high enough process timescale, $\tau_{paint}$.

This term ($\tau_{paint}$) can be used to define a non-dimensional process time (t*) as the ratio between the actual process fluid spread time (t) and $\tau_{paint}$, as $$t^* = \frac{t}{\tau_{paint}} \quad (3)$$

The aim is to minimize this redistribution such that the final film thickness has a strong correlation with the initial material distribution so that the "programmable" nature of PAINT-C can be achieved by the pre-defined locations and volumes of the inkjetted fluid drops. In other words, this dynamic model reveals the fact that it is imperative to capture a pre-equilibrium transient state in the evolution of the sandwich because the equilibrium state allows for only one possible steady state solution that is typically undesirable and is corrupted by the parasitic topography of substrate 202 (not shown in FIGS. 3A-3F). This defeats the purpose of the programmable deposition of thin films. This concept of capturing pre-equilibrium transients that substantially correlates with the inkjetted fluid drops and rejects the effects of substrate and superstrate topography, including their nominal shapes and effect of gravity.

From the standpoint of delaying equilibrium, it is desirable to make superstrate 304 as thin as possible. However, making superstrate 304 arbitrarily thin is not feasible as discussed above in the context of optimal flexibility. In addition, thin superstrates 304 may be difficult to handle for automation, loading, etc.

Because gravity aids in fluid redistribution, especially for highly curved substrates, minimizing the influence of gravity is tantamount to reducing the thickness of superstrate 304. For substrates 302 with high curvature, the influence of gravity can be minimized by moving substrate 302 through a combination of rotations such that areas of high curvature can be made as horizontal as possible. This can be achieved by mounting substrate 302 and superstrate chuck 409 on precise flexure-based actuators. If, however, moving one or more areas of substrate 302 compromises with other areas of substrate 302 in terms of their horizontal leveling, an approach involving cycling the superstrate-fluid-substrate sandwich through different states, such that different areas on substrate 302 are substantially horizontal periodically, can be performed. The frequency of oscillations between these different states can be determined from the approximate time scale of the capillary filling process, which is a function of the viscosity, surface tension and specific weight. The inverse of this time scale gives the approximate frequency, and if the oscillation frequency is kept significantly higher than this capillary frequency, the fluid sandwich does not get redistributed between each oscillation and minimizes the influence of gravity. In one embodiment, the influence of gravity is minimized by keeping superstrate 304 as thin as possible (e.g., thickness of superstrate 304 below a threshold, such as 200 microns as discussed above). In one embodiment, the influence of gravity is minimized by mounting the system on a rotation stage and rotating the superstrate-fluid-substrate sandwich at a frequency high enough to overcome gravity-induced visco-capillary filling.

As mentioned earlier, first order properties of the model can be obtained analytically by conducting a linear analysis with $\tilde{h}(\tilde{r},t)=1+\tilde{\in}(\tilde{r},t)$ where $\|\tilde{\in}\|\ll 1$, where r is in the nominal substrate surface coordinate system. This leverages work done for PAINT. It is important to factor the presence of substantial substrate topography to not obfuscate model linearization. However, establishing a proper substrate coordinate system that accounts for the substrate topography is necessary to ensure that the linearization yields feasible results. The linearized model can be solved analytically thereby drastically reducing computational complexity and allowing for a key aspect of PAINT-C to be solved: optimal locations and volumes of fluid drops for a desired film thickness profile. Another important aspect of the inverse optimization process is the correlation of substrate curvature with the inkjet gap height. Once optimum drop locations and volumes are identified and attached to specific substrate coordinates, the graining and relative motion profiles of substrate 302 with respect to inkjet 303 can also be optimized to allow only specific nozzles to fire that are within the optimum inkjetting range. This is also augmented with an algorithm that optimizes the stitching a drop pattern on a grain with drop patterns on adjacent grains, with high enough precision to not compromise the final film thickness profile. In addition, the inverse optimization algorithm is further modified to account for curvature by allowing for variable drop pitch on substrate 302. This is because the planar inkjet surface, which has multiple nozzles at a given pitch which is usually uniform, is mapped onto a non-planar substrate with curvature. This mapping can cause the usually uniform drop pitch on inkjet 303 to become non-uniform as measured along the substrate surface. This non-uniformity may be overcome in the direction of relative scan between substrate 302 and inkjet 303 by adjusting the scan speed in real time.

In addition to the inverse optimization for an optimum film thickness profile based on process mechanics, an important aspect of the PAINT process involves a wrapped functional optimization scheme. This scheme is explained herein for an exemplar application of PAINT in optical components, but can be extended to other domains where PAINT is used for figure correction, polishing and/or nanopatterning. The need for such optimization arises because deviations from a desired film thickness profile can lead to deviations in device performance, such as optical performance arising because of issues, such as undesirable interference, aberrations, flares, etc. The manifestation of these problems may not have a linear correlation with the film thickness profile. Moreover, depending on the application, one or more of these problems may have extremely tight tolerance specifications, that may be violated by slight deviations from the desired film thickness profile. Hence, it may be important to constrain the film thickness optimization with an additional scheme that also calculates the functional performance of the system during the course of the optimization. The computational cost of this higher-level constraint may slow down the inverse optimization scheme, and based on how high the computational cost is, an approach can be taken wherein optical performance calculations are undertaken intermittently, at a frequency that is not computational cost-prohibitive, rather than for each sub-optimal film thickness profile obtained while performing the optimization.

Another unusual aspect of the process is the ease with which multi-layer films—either of the same material or of different materials—can be deposited. From the thin film model, it is evident that keeping the mean film thickness ($h_o$) small helps in keeping the time scale high which is desirable for capturing non-equilibrium transients (equation 2). Hence, it can be problematic to deposit thick uniform films or films with large thickness variations in a single step that may be required when substrate curvature becomes too steep. This can be alleviated by decomposing the desired profile into a sum of smaller unit increments, which ensures that the time scale is desirably high for each unit step and thus, preserves the knowhow and corresponding accuracy established for a single-step process.

Because the preferred method for deposition is inkjetting, a multi-step process can be extended to the deposition of multi-material stacks by using different inkjettable materials, such that each layer in the stack has a prescribed profile. This enables the deposition of films with material as well as thickness gradients in its depth direction, a feature that is not easily available in the current state-of-the-art. This process could be achieved by having a set of multi-jets with distinct materials in each of the multi-jets. The entire process could be achieved without substrate 302 being removed from the tool between the various individual PAINT-C steps.

The multi-step process also enables subsequent nanopatterning using discrete drops or solvent-assisted layer formation on the previously deposited films. This can be particularly useful for optical applications where special films and/or nanostructures need to be formed for desired properties, such as anti-reflection, anti-fouling and anti-static on the same substrate in multi-layer stacks. As previously discussed, a superstrate 304 with a release layer, such as an oxide or heavy metal like gold, can facilitate the spreading of the liquid monomer and also the separation between substrate 302 with the solidified polymer 308 and superstrate 304. This is especially valuable for deposition of multi-layer films of the same material followed by nanopatterning as a last step. The nanopatterning may or may not be conducted using the same material from the previous deposition steps. Hence, it becomes important to get the correct release properties on the superstrate/template to ensure good separation across a broad range of patterns including the unpatterned superstrate. Moreover, the monomer material may also be formulated to have just enough surfactant such that when cured, it facilitates the spreading of the next liquid layer and when combined with a release layer on the superstrate/template, it allows the cured film to stick to itself rather than the superstrate or template.

The deposition of spatially varying films on non-planar surfaces, used optionally with nanopatterning, has some applications in consumer optics, high precision optics including those for X-rays and fabrication of ultra-precise molds, biomedical optics, specialized eye wear, etc. These are by no means an exhaustive list of applications for PAINT-C.

With respect to consumer optics, freeform surfaces are regularly used in consumer eyewear for vision correction, which includes problems, such as myopia, hyperopia, regular astigmatism, irregular astigmatism, presbyopia and other disorders. In general, problems in optical systems, including the eye, are characterized using optical aberrations, i.e., distortions in the radiation wavefront because of these systems. These aberrations are typically expressed as a series expansion of Zernike polynomials (lower-order and higher-order Zernike polynomial aberrations). The first two orders of this polynomial expansion are called lower orders. The third order and above terms are called higher-order terms. The commonly observed spherical and cylindrical powers in human eyes, for example, are categorized as lower-order aberrations. On the other hand, there are a number of higher-order aberrations, such as spherical aberration, coma, trefoil, etc., that can cause problems with visual acuity. Hence, it is important to mitigate the presence of these higher order aberrations, while also correcting for the more common lower-order aberrations.

Eyeglass lenses have evolved from simple spherical geometries to aspheric, atoric and other freeform geometries. This has enabled eyeglass lenses to be aesthetically pleasing as well as offer superior optics without distortions. Today, lenses ranging from mono vision to progressive addition (that are multi-focal lenses) are offered with "digital" processing, implying that instead of being molded, the lens surfaces have been cut as freeform surfaces in different geometries on single point diamond cutting and milling tools. Progressives basically have different profiles in different areas of the lens thereby allowing the eyeglass wearer to use these various areas for different vision correction outcomes. PAINT-C can be a relatively low-cost alternative to generate these freeform surfaces on substrates that are nominally curved with higher precision at little or no added cost. Moreover, PAINT-C also has the added benefit of being an integrated solution for polishing as well as deposition of additional thin films including anti-reflective, scratch-resistant and anti-static layers. These films may also include nanostructures that can be patterned in the same step in combination with the profile control offered by PAINT-C. The curved substrates are typically spherical surfaces having ~75 mm diameter and radius of curvature ranging from 0.01 to 20 m.

One of the more specific applications includes remediation for early to mid-stages of keratoconus, which is a progressive eye disease caused by abnormal thinning and bulging of the cornea. This causes extremely high astigmatic powers with much larger aberrations of higher order. Such cases are often treated using surgical intervention and/or special contact lenses. While the former may be cost prohibitive, the latter is not ideal because continuous wearing of contact lenses can lead to other ophthalmic problems. Hence, this is an area which can potentially benefit from the freeform fabrication of eyeglasses offered using PAINT-C. Another application is that of "super-normal" vision, where highly precisely profiled eyeglasses can be used to achieve visual acuities better than 20/20 and as good as the highest possible acuity of ~20/8. The eyeglasses profile may remove all visual aberrations, including lower-order and higher-order aberrations, and be designed for precise placement with respect to the reference optical axis. While super-normal vision would aim to achieve the ideal visual acuity of ~20/8, this can result in the presence of chromatic aberrations that can reduce visual function. Hence, the goal would be to achieve practical super-normal vision, i.e., visual acuities of ~20/12 to ~20/15 without introducing parasitic chromatic aberrations. Alternatively, practical super-normal vision may also be achieved in these lenses by tailoring the geometry to achieve the high visual acuities in a substantially narrow field of view compared to the broad field of view under normal viewing situations. This could allow the user to perform specific tasks that would require the presence of substantially higher visual acuity while achieving normal visual acuity in a larger field of view.

The deposition of spatially varying films on non-planar surfaces also has an application involving surfaces for low curvature freeform optics.

Reflective optics for X-rays relies on metal-coated mirrors for focusing purposes. They are mostly used for hard X-rays given the challenges involved in using zone plates for the same. However, reflective mirrors use grazing incidence, i.e., near zero incidence angles, to achieve the desired resolution and focus, although this requirement is relaxed for multilayer mirrors that rely on interference related reflection. For example, critical angles of approximately 2 degrees, 0.6 degrees and 0.1 degrees are required for an iridium sample with X-rays of energy 1, 10 and 200 keV, respectively, to achieve total external reflection. Given this constraint, it can be imagined that these mirrors require stringent spatial control over the surface roughness and figure ($\sim\lambda/10$), which is analogous to nanotopography for wafers. The wavelength of X-rays is <10 nm, which implies that the desired spatial control is <1 nm. Any perturbation in roughness and figure above this tolerance limit can cause undesired scattering effects. Hence, adaptive figure correction is an important element for getting the desired quality of the optical elements. Moreover, the desired profile of a mirror surface is usually a conic section (parabolic, hyperbolic or elliptical), such that an arrangement of multiple such mirrors can achieve the desired focusing properties. Such profiles have been demonstrated by vacuum based preferential coating or differential deposition techniques on surfaces that are not nominally conic sections. PAINT-C potentially, has the ability to do both, correct for figure imperfections as well as adaptively modifies the figure to resemble conic section surfaces by depositing films with appropriate spatial variations in thickness. A deposition of such a film may be followed by a "matched etch-back," where the resist and the substrate surface etch are etched at the same rate. This may be continued till the resist is completely removed such that the profile of the surface becomes that of an X-ray mirror. To enable functionality, a single or multiple metal layers can then be deposited using PVD or ALD.

Corrector plates, or more specifically, Schmidt corrector plates, are essentially aspheric lenses designed to compensate for the spherical aberrations caused by the primary spherical mirrors in an optical system, such as a telescope. It is quite well known that typical spherical mirror configurations lead to undesirable higher order aberrations, of which spherical aberration is the most dominant manifestation. It is an intrinsic property of the geometry of a spherical mirror, but can be exacerbated by errors in fabrication. Aspheric lenses can be used to correct for these aberrations by providing a profile that compensates for these aberrations, and when used in the light path before spherical mirrors in imaging systems, are called Schmidt corrector plates. Since these plates are often used in high-end applications with a need for tight control over undesired aberrations, these plates need to be precisely fabricated. This is where PAINT-C can be beneficial, as it can not only provide the right figure with minimal mid- and high-spatial frequency parasitics, but can also apply coatings or nanostructures for properties, such as anti-reflection to minimize losses due to reflection. Moreover, with nanopatterning capability, it is also possible to fabricate polarizers (including wire-grid polarizers) on these plates if a particular polarization is also desired.

Nanoscale photonic structures enable several nonlinear phenomena (e.g., metamaterials for cloaking, negative index of refraction, etc.) that may have applications in different areas. Low-cost large-area fabrication of these nanostructures can further lower the adoption barrier of these technologies. One way to lower costs is to facilitate the fabrication of a full wafer circuit of nanophotonic structures, containing several different photonic elements (polarizers, color filters, waveguides, other metamaterials etc.) in a single step with low defectivity. This is currently difficult to achieve because the different photonic elements have varying pattern geometry or directionality. For example, polarizers tend to be a one-dimensional array, whereas, color filters tend to be a two-dimensional array of nanostructures. This often leads to defects at the boundaries of different patterns, or when patterns tend to be highly directionally biased. However, with PAINT, such defects can be minimized by optimizing the drop pattern to discern between this pattern geometry and/or directionality variation. PAINT can enable optimal drop locations and volumes, such that the layer prior to template contact has the desired thickness variation that can mitigate pattern boundary and/or directionality effects. This can lead to a substantially uniform residual layer across the entire photonic circuit, thereby allowing for more uniform post-processing.

In another embodiment, the residual layer arising from contact and filling of the template from the solvent-assisted imprint monomer layer can be made intentionally non-uniform for what might be a substantially uniform pattern on the template. Then, through subsequent post-processing etch steps, intentional variations in the critical dimension and/or height of this otherwise uniform pattern can be achieved. This can enable analog modulation of photonic phenomena on a single wafer and can thereby allow high-throughput combinatorial experiments. All of this has to be supported by an appropriate functional optimization routine, as previously discussed. This can also be extended to the case where there are variations of pattern geometry on the template.

In ultra-precision applications (optical components, photomasks for photolithography, etc.) the presence of gravity might lead to undesirable parasitics. For example, gravity can lead to in-plane and out-of-plane distortions that can be disruptive to precision alignment of nanoscale patterns when writing photomasks using e-beam lithography. However, if these distortions are compensated for by depositing a film having a complementary profile, parasitics associated with gravity can be substantially mitigated.

Alvarez lenses, named after their original inventor, are essentially lens doublets that allow translation of the two lenses in opposite directions for tunable analog power adjustment. This is achieved by making the individual lens surfaces with a precisely defined cubic profile. In recent years, this idea has been advanced to include adjustment of astigmatism, perform focus and astigmatism correction around a non-zero prescription, as well as for analog accommodation for presbyopes. However, for this technique to work, the fabrication and translation of the individual lens surface profiles has to be done precisely. If not, it can lead to significant parasitics that can degrade the quality of vision correction. With its nanoscale precision, PAINT-C has the ability to fabricate not only 2D cubic profiles over large areas, but also 2D profiles with higher order polynomials that can potentially achieve correction of higher-order aberrations as well with the same mutual translation of the lens surfaces. Moreover, the lens surfaces can also be designed to correct for specific aberrations at intermediate translation distances, thereby allowing vision correction for specific tasks, such as normal-light reading, low-light driving, intermediate-distance typing, etc. These aberrations may include higher order aberrations, such as spherical aberrations and coma, caused by large pupil sizes in low light conditions, or those arising from irregular astigmatism because of corneal scars or shape defects. These aberrations are typically difficult to correct and vary in different illumination conditions, making a constant correction pair of eyeglasses unviable. Such lenses can be integrated into a frame with a translation mechanism that can be either analog or discrete depending on the preference of the user. Hence, for this application, PAINT-C can provide broad customization and versatility across different vision needs. The aim is to allow the user a pathway for getting to the desired "vision" profile, for which an automated solution may be provided. This solution may consist of a hierarchical approach, where a coarse path is given to achieve a near-desirable vision path, followed by fine correction to get to the most desired visual acuity. If such a solution is not given, the user might have difficulty exploring the entire combinatorial set to get to the desired vision profile. This idea can potentially be extended for aberration correction in optical devices, such as microscopes, that may suffer from wavefront deviations due to thermal, vibration or other ambient noise.

The combination of PAINT-C with nanopatterning can also be useful in several nanophotonics applications. In general, the nanopatterned structures can be formed directly on a non-planar substrate, or fabricated on a planar substrate which is then glued or attached to a precisely profiled non-planar substrate. The process of directly fabricating these nanopatterns or gluing them from planar films, can lead to feature distortions because of mechanical stress induced in a substantially planar template that conforms to a non-planar substrate. However, this distortion can be compensated in the design of the nanoscale pattern in the template itself, such that when fabricated, the nanoscale features are substantially distortion free. This compensation can be achieved by solving an inverse problem where the intentional distortion on the substantially planar template which is needed to fix the subsequent distortion on the substantially non-planar substrate can be obtained through methods, such as finite element analysis. In another embodiment, this distortion can be overcome in real-time by using force actuators, such as one or more piezoelectric actuators that apply optimum loads on the substantially planar template. One application is in the area of hyperspectral imaging in which spatial, spectral as well as other information is desired for an object. This is typically achieved using a tunable color filter, consisting of a diffractive optical element glued to an adjustable focus lens. The diffractive element acts like a prism and splits polychromatic light into its constitutive components, each having a different focal length. The adjustable focus lens is then used to change the focus of the system so as to accentuate one wavelength over the other. By combining PAINT-C with nanopatterning in an Alvarez lens setup, the diffractive element, which typically is a diffraction grating with nanoscale features, can be patterned in conjunction with obtaining the appropriate surface profile for the first lens element. The second element in the Alvarez doublet may also be patterned for additional features, such as increased transmission, anti-reflection etc., or kept unpatterned. The surface profiles can be optimized to minimize higher-order aberrations across different wavelengths so as to achieve optimal performance of the system.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for depositing thin films, the method comprising:
dispensing drops of a pre-cursor liquid organic material at a plurality of locations on a nominally non-planar substrate by one or more inkjets;
closing a gap bringing between a superstrate and said substrate thereby allowing said drops to form a contiguous film captured between said substrate and said superstrate;
enabling a non-equilibrium transient state of said superstrate, said contiguous film and said substrate to occur after a duration of time by allowing said superstrate, said contiguous film and said substrate to evolve to a time pre-determined by an inverse optimization routine prior to said dispensing of said drops of said pre-cursor liquid organic material;
curing said contiguous film to solidify it into a solid; and
separating said superstrate from said solid thereby leaving a polymer film on said substrate.

2. The method as recited in claim 1, wherein said substrate comprises one of the following: a spherical surface, an aspherical surface, a toric surface, a cylindrical surface, a conic section and a freeform surface.

3. The method as recited in claim 1 further comprising:
virtually dividing said substrate into two-dimensional grains, wherein each of said two-dimensional grains has a peak-valley difference not exceeding an optimal jetting range of an inkjet, wherein each of said two-dimensional grains is treated as an individual substrate by said inkjet on which said inkjet dispenses a drop pattern that corresponds to a two-dimensional grain.

4. The method as recited in claim 3 further comprising:
using a coordinated relative motion of said substrate and said inkjet in order to not exceed said optimum jetting range of said inkjet and to stitch said inkjetted drop pattern corresponding to each of said two-dimensional grains with inkjetted drop patterns of adjacent two-dimensional grains to create a single desired inkjet pattern on said substrate.

5. The method as recited in claim 1, wherein said plurality of locations on said nominally non-planar substrate are derived from an inverse optimization framework.

6. The method as recited in claim 1 further comprising:
aligning coordinate frames between said substrate and a reference surface to ensure said drops of said pre-cursor liquid organic material are dispensed at correct locations.

7. The method as recited in claim 1, wherein a back surface of said substrate or said superstrate is held by a chuck over an area which is less than an entirety of an area of said back surface.

8. The method as recited in claim 1, wherein a back surface of said substrate or said superstrate is held by a chuck over an area that is substantially an entirety of an area of said back surface.

9. The method as recited in claim 1, wherein a back surface of said substrate or said superstrate is curved, wherein chucking of said substrate or said superstrate is performed using one of the following: using a chuck with a complementary profile to that of a back side of said substrate or said superstrate, chucking said back surface in regions that are coplanar, adding a planar back surface and chucking said planar back surface.

10. The method as recited in claim 1, wherein said substrate or said superstrate is chucked on a back side using a multi-region chuck, wherein one or more regions of said chuck are engaging vacuum and one or more other regions of said chuck are pressurizing said substrate or said superstrate.

11. The method as recited in claim 1, wherein said superstrate is a roll-to-roll film with appropriate tension control to achieve optimal bending rigidity without encountering tensile yield or buckling failure, wherein said tension is controlled to be high during drop merging and controlled to be low after said drop merging.

12. The method as recited in claim 11, wherein said roll-to-roll film is advanced to bring in clean superstrates to minimize propagation of contamination defects from one substrate to another.

13. The method as recited in claim 1, wherein said superstrate has a complementary shape to that of said substrate.

14. The method as recited in claim 1, wherein said superstrate is composed of a thin film attached to or coated on a thicker backing.

15. The method as recited in claim 14, wherein said thin film is attached to said thicker backing which does not extend over an entire area of said thin film.

16. The method as recited in claim 1, wherein an inkjet of said one or more inkjets consists of a platform with multiple nozzles that can be individually adjusted in a vertical direction.

17. The method as recited in claim 1, wherein handles are attached to a superstrate chuck to assist in separation of a non-planar superstrate from a non-planar substrate.

18. The method as recited in claim 1, wherein said superstrate comprises a sacrificial film that is removed using photochemical ablation.

19. The method as recited in claim 1, wherein a liquid volume dispensed compensates for parasitics comprising one of the following: an evaporation profile of the liquid prior to it being captured between said substrate and said superstrate, shrinking effects across said contiguous film caused during solidifying, and non-uniform etch signatures coming from an etcher during post-processing.

20. The method as recited in claim 1, wherein pre-equilibrium transients create a film thickness profile whose volume distribution is a function of a volume distribution of fluid drops dispensed on said substrate.

21. The method as recited in claim 1, wherein said substrate is discretized into grains, wherein a location and volume of drops dispensed in each grain are obtained by using an inverse optimization to minimize an error between a function of an actual film thickness profile and a function of a desired film thickness profile.

22. The method as recited in claim 1, wherein a location and volume of drops dispensed on said substrate are obtained by using an inverse optimization to minimize an error between a function of an actual film thickness profile and a function of a desired film thickness profile.

23. The method as recited in claim 22, wherein said inverse optimization is augmented with a functional optimization routine to minimize an error between the desired and actual functional performance.

24. The method as recited in claim 22, wherein said inverse optimization comprises discrete variables associated with drop volumes or drop locations.

25. The method as recited in claim 22, wherein said inverse optimization comprises an influence of gravity in the presence of non-planar surfaces.

26. The method as recited in claim 25, wherein said influence of gravity is minimized by having a thickness of said superstrate being below a threshold.

27. The method as recited in claim 25, wherein said influence of gravity is minimized by rotating a superstrate-fluid-substrate sandwich at a frequency high enough to overcome gravity-induced visco-capillary filling.

28. The method as recited in claim 22 further comprising:
using a linearized model as part of said inverse optimization.

29. The method as recited in claim 1, wherein said polymer film is solidified by light or thermal curing.

30. The method as recited in claim 1, wherein said polymer film is subject to etching to allow a transfer of a film thickness profile to an underlying functional film or said substrate.

31. The method as recited in claim 1, wherein a minimum volume of drops dispensed is below 10 picoliters using either piezo jets or electro hydro dynamic jets.

32. The method as recited in claim 1, wherein a minimum volume of drops dispensed is below 1 picoliter using either piezo jets or electro hydro dynamic jets.

33. The method as recited in claim 1, wherein said method for depositing thin films is applied for correcting errors in optical systems by correcting low- and mid-spatial frequency topography on said substrate without introducing parasitic errors of its own.

34. The method as recited in claim 1, wherein said method for depositing thin films is applied to fabricate two precision optical components of enhanced Alvarez lenses.

35. The method as recited in claim 1, wherein said method for depositing thin films is applied to generate freeform surfaces for consumer eyewear.

36. The method as recited in claim 1, wherein said method for depositing thin films is applied to compensate for lower-order Zernike polynomial optical aberrations.

37. The method as recited in claim 1, wherein said method for depositing thin films is applied to compensate for higher-order Zernike polynomial optical aberrations.

38. A method for depositing thin films, the method comprising:
depositing drops of a liquid solidifiable composition using a jetting system in a prescribed manner on a substrate, wherein said liquid solidifiable composition does not substantially penetrate a previously solidified composition; and
closing a gap between said substrate and a superstrate in a manner that merges said drops to form a contiguous film captured between said substrate and said superstrate, wherein said superstrate is locally smooth and possesses optimal bending rigidity;
wherein said bending rigidity is in an optimal range defined by it being higher than a minimum required to create a robust merging of said drops, while lower than a maximum required to ensure that said contiguous film does not equilibrate too quickly thereby providing an ability to capture pre-equilibrium transients.

39. The method as recited in claim 38, wherein said liquid solidifiable composition is substantially the same in subsequent deposition of said liquid solidifiable composition.

40. The method as recited in claim 38, wherein said liquid solidifiable composition is different in subsequent deposition of said liquid solidifiable composition.

41. A method for patterning on non-planar substrates, the method comprising:
applying a multiplicity of discrete portions of a fluid composition onto a surface of a non-planar substrate;
closing a gap between a patterned template and said substrate leading to a fluid layer that is substantially free of bubbles;
solidifying said fluid layer; and
separating said patterned template from said substrate to leave behind a pattern on said non-planar substrate.

42. The method as recited in claim 41, wherein said method for patterning on non-planar substrates is applied for obtaining optical surfaces with nanophotonic structures while also correcting for low- and mid-spatial frequency topography errors.

* * * * *